(12) United States Patent
Chang et al.

(10) Patent No.: US 11,476,219 B2
(45) Date of Patent: Oct. 18, 2022

(54) METAL-BUMP SIDEWALL PROTECTION

(71) Applicant: Taiwan Semiconductor Manufacturing Co., Ltd., Hsinchu (TW)

(72) Inventors: Jung-Hua Chang, Hsinchu (TW); Jian-Yang He, Tainan (TW); Chin-Fu Kao, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 121 days.

(21) Appl. No.: 17/026,983

(22) Filed: Sep. 21, 2020

(65) Prior Publication Data

US 2021/0005564 A1 Jan. 7, 2021

Related U.S. Application Data

(62) Division of application No. 16/176,017, filed on Oct. 31, 2018, now Pat. No. 10,784,222.

(51) Int. Cl.
*H01L 21/78* (2006.01)
*H01L 23/31* (2006.01)
(Continued)

(52) U.S. Cl.
CPC ............. *H01L 24/11* (2013.01); *H01L 21/56* (2013.01); *H01L 21/78* (2013.01); *H01L 23/293* (2013.01); *H01L 23/3171* (2013.01); *H01L 24/10* (2013.01); *H01L 24/16* (2013.01); *H01L 24/73* (2013.01); *H01L 24/81* (2013.01); *H01L 24/83* (2013.01); *H01L 24/92* (2013.01); *H01L 24/94* (2013.01); *H01L 25/50* (2013.01); *H01L 24/13* (2013.01); *H01L 24/32* (2013.01); *H01L 2224/0239* (2013.01); *H01L 2224/10145* (2013.01); *H01L 2224/10175* (2013.01); *H01L 2224/11013* (2013.01);
(Continued)

(58) Field of Classification Search
CPC .................... H01L 24/11; H01L 24/73; H01L 2224/023911; H01L 2224/1191
See application file for complete search history.

(56) References Cited

U.S. PATENT DOCUMENTS 6,888,255 B2 * 5/2005 Murtuza ................ H05K 1/111
257/737
8,455,969 B2 6/2013 Nabe et al.
(Continued)

FOREIGN PATENT DOCUMENTS

CN 101308845 A 11/2008
CN 101542726 A 9/2009
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method includes forming a metal bump on a top surface of a first package component, forming a solder region on a top surface of the metal bump, forming a protection layer extending on a sidewall of the metal bump, reflowing the solder region to bond the first package component to a second package component, and dispensing an underfill between the first package component and the second package component. The underfill is in contact with the protection layer.

20 Claims, 24 Drawing Sheets

(51) Int. Cl.
  *H01L 23/00* (2006.01)
  *H01L 25/00* (2006.01)
  *H01L 21/56* (2006.01)
  *H01L 23/29* (2006.01)

(52) U.S. Cl.
  CPC ............. *H01L 2224/1146* (2013.01); *H01L 2224/11849* (2013.01); *H01L 2224/13111* (2013.01); *H01L 2224/13139* (2013.01); *H01L 2224/13147* (2013.01); *H01L 2224/13155* (2013.01); *H01L 2224/13164* (2013.01); *H01L 2224/16145* (2013.01); *H01L 2224/32145* (2013.01); *H01L 2224/73204* (2013.01); *H01L 2224/81007* (2013.01); *H01L 2224/81193* (2013.01); *H01L 2924/014* (2013.01)

(56) References Cited

U.S. PATENT DOCUMENTS

| | | |
|---|---|---|
| 9,287,171 B2 | 3/2016 | Wu et al. |
| 9,735,098 B2 | 8/2017 | Arisaka et al. |
| 9,768,138 B2 | 9/2017 | Shen et al. |
| 10,083,927 B2 | 9/2018 | Chen et al. |
| 10,475,758 B2 | 11/2019 | Yang et al. |
| 10,535,626 B2 * | 1/2020 | Uzoh .................. H01L 24/17 |
| 2004/0121606 A1 | 6/2004 | Raskin et al. |
| 2011/0291262 A1 | 12/2011 | Shen et al. |
| 2011/0298123 A1 | 12/2011 | Hwang et al. |
| 2012/0146212 A1 | 6/2012 | Daubenspeck et al. |
| 2013/0341786 A1 | 12/2013 | Hsu et al. |
| 2015/0092371 A1 | 4/2015 | Meinhold |
| 2015/0325546 A1 | 11/2015 | Hwang et al. |
| 2015/0340332 A1 | 11/2015 | Rinne et al. |
| 2015/0380357 A1 | 12/2015 | Liu et al. |
| 2016/0099223 A1 | 4/2016 | Hsieh et al. |
| 2016/0104685 A1 * | 4/2016 | Shen .................. H01L 24/16 257/737 |
| 2017/0040308 A1 | 2/2017 | Ko |
| 2018/0082954 A1 | 3/2018 | Lin et al. |
| 2018/0138115 A1 * | 5/2018 | Lu .................. H01L 23/49816 |
| 2018/0151522 A1 | 5/2018 | Yang et al. |

FOREIGN PATENT DOCUMENTS

| | | |
|---|---|---|
| CN | 102263067 A | 11/2011 |
| CN | 106469701 A | 3/2017 |
| JP | 2017098306 A | 6/2017 |
| KR | 20140000608 A | 1/2014 |
| KR | 20150135127 A | 12/2015 |
| KR | 20170016550 A | 2/2017 |
| WO | 2010057339 A1 | 5/2010 |

* cited by examiner

METAL-BUMP SIDEWALL PROTECTION

PRIORITY CLAIM

This application is a divisional of U.S. patent application Ser. No. 16/176,017, entitled "Metal-Bump Sidewall Protection," filed on Oct. 31, 2018, which application is incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In conventional packaging methods, a Package-on-Package (PoP) structure may be formed. The PoP structure includes a bottom package, and a top package bonded to the bottom package. To form the bottom package, a device die is first molded in a molding compound, with the metal bumps of the device die exposed through the molding compound. Redistribution Lines (RDLs) that are used for rerouting electrical signal to a greater area than the device die are then formed on the molding compound and the device die. Metal bumps and/or solder regions may be formed, which are used to join the bottom package to the top package.

Another packaging method is known as Chip-on-Wafer-on-Substrate (CoWoS). In the respective packaging, a first plurality of device dies are first bonded to a wafer, which includes a second plurality of device dies therein. The bonding may be through micro bumps or solder regions. An underfill is then dispensed into the gaps between the first plurality of device dies and the second plurality of device dies. The wafer is then singulated into a plurality of packages. Each of the packages is bonded to a package substrate, for example, through solder regions. Another underfill is then dispensed between the package and the package substrate that are bonded together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
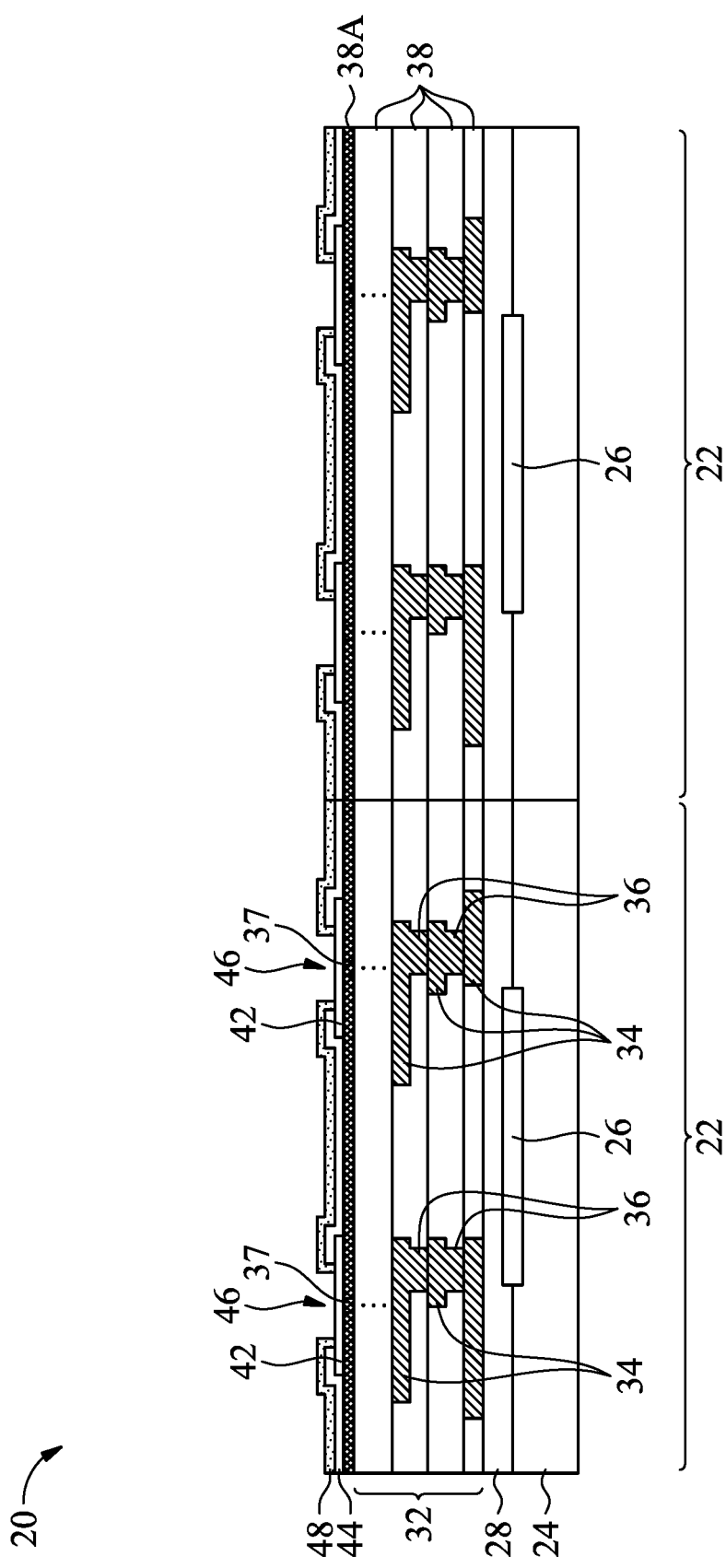
FIGS. 1 through 10 illustrate the cross-sectional views of intermediate stages in the formation of a package component including protection layers on the sidewalls of micro bumps in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages in the formation of the package are illustrated in accordance with some embodiments. Some variations of some embodiments are discussed. Throughout the various views and illustrative embodiments, like reference numbers are used to designate like elements.

In accordance with some embodiments of the present disclosure, dielectric protection layers are formed on the sidewalls of metal bumps, so that the sidewalls of the metal bumps are not wettable to solder. As a result, the solder regions that bond the metal bumps to other package components will not be able to migrate/wet on the sidewalls of the metal bumps. The void in the solder regions caused by the solder migration is thus avoided.

Figure 24:
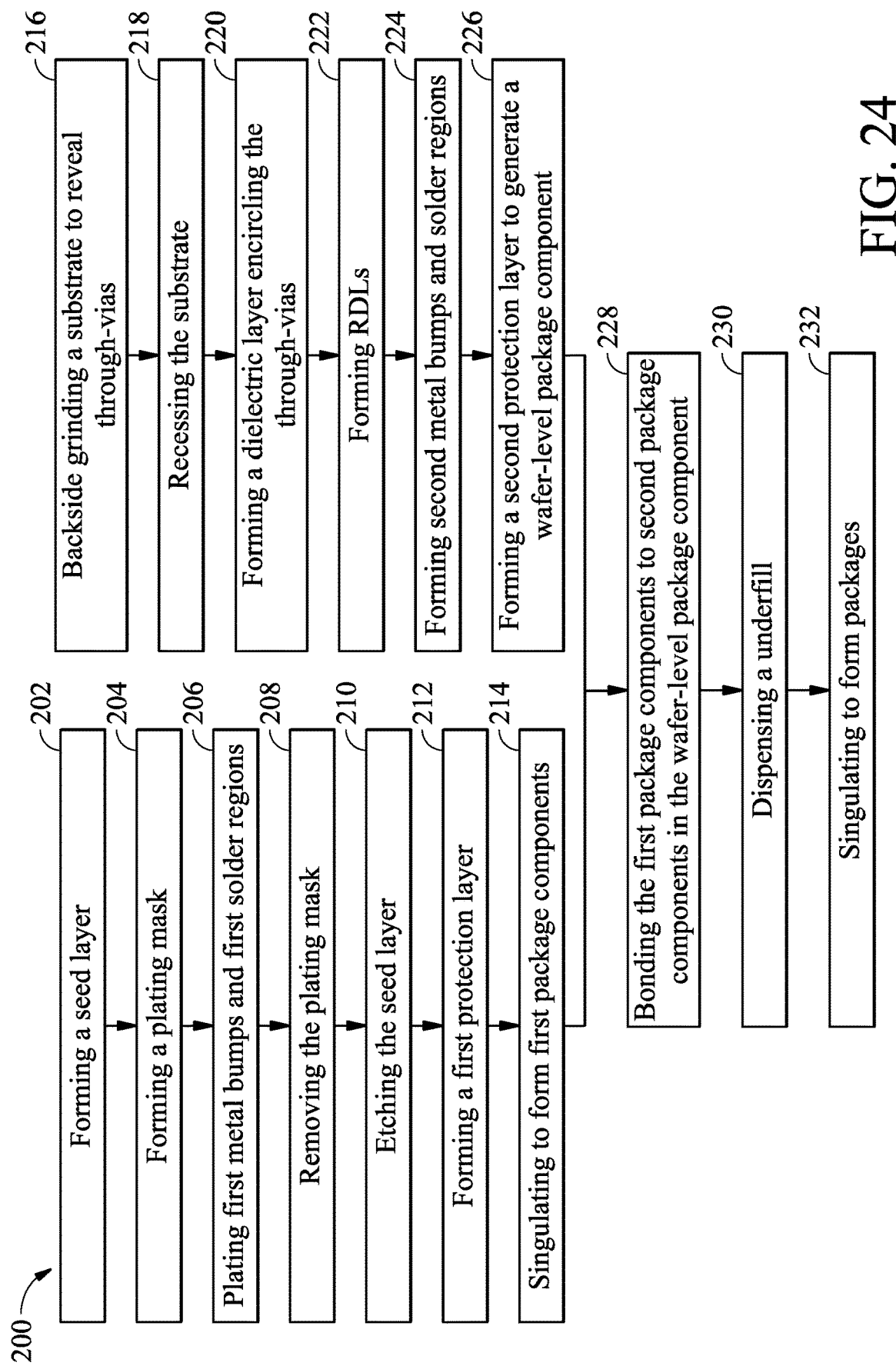
FIG. 24 illustrates a process flow for forming a package in accordance with some embodiments.

FIGS. 1 through 10 illustrate the cross-sectional views of intermediate stages in the formation of a package component in accordance with some embodiments of the present disclosure. The corresponding processes are also reflected schematically in the process flow 200 as shown in FIG. 24.

FIG. 1 illustrates a cross-sectional view of package component 20. Device package component 20 may include a plurality of package components 22 therein, with two of package components 22 illustrated as examples. In accordance with some embodiments of the present disclosure, package component 20 is a device wafer including active devices and possibly passive devices, which are represented as integrated circuit devices 26. In accordance with alternative embodiments of the present disclosure, package component 20 is an interposer wafer, which may or may not include active devices and/or passive devices. In accordance with yet alternative embodiments of the present disclosure, package component 20 is package substrate strip, which includes a plurality of package substrates. Package component 20 may also be a reconstructed wafer including a plurality of packages therein. In subsequent discussion, a device wafer is discussed as an example of package component 20, while the embodiments of the present disclosure may also be applied on interposer wafers, package substrates, packages, reconstructed wafers, etc.

In accordance with some embodiments of the present disclosure, package component 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaN, GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown in FIG. 1, through-vias (sometimes referred to as through-silicon vias or through-semiconductor vias) may be formed to extend into semiconductor substrate 24, wherein the through-vias are used to electrically inter-couple the features on opposite sides of package component 20.

In accordance with some embodiments of the present disclosure, package component 20 includes integrated circuit devices 26, which may include some portions formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, package component 20 is used for forming interposers, and substrate 24 may be a semiconductor substrate or a dielectric substrate.

Inter-Layer Dielectric (ILD) 28 is formed over semiconductor substrate 24 and fills the space between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), Tetra Ethyl Ortho Silicate (TEOS) oxide, or the like. In accordance with some embodiments of the present disclosure, ILD 28 is formed using a deposition method such as Plasma-Enhanced Chemical Vapor Deposition (PECVD), Low Pressure Chemical Vapor Deposition (LPCVD), spin-on coating, Flowable Chemical Vapor Deposition (FCVD), or the like.

Contact plugs (not shown) are formed in ILD 28, and are used to electrically connect integrated circuit devices 26 to overlying metal lines and vias. In accordance with some embodiments of the present disclosure, the contact plugs are formed of a conductive material selected from tungsten, aluminum, copper, titanium, tantalum, titanium nitride, tantalum nitride, alloys therefore, and/or multi-layers thereof. The formation of the contact plugs may include forming contact openings in ILD 28, filling a conductive material(s) into the contact openings, and performing a planarization (such as a Chemical Mechanical Polish (CMP) process or a mechanical grinding process) to level the top surfaces of the contact plugs with the top surface of ILD 28.

Over ILD 28 and the contact plugs is interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material and then performing a curing process to drive out the porogen, and hence the remaining dielectric layers 38 are porous.

The formation of metal lines 34 and vias 36 may include single damascene and/or dual damascene processes. In a single damascene process, a trench is first formed in one of dielectric layers 38, followed by filling the trench with a conductive material. A planarization such as a CMP process is then performed to remove the excess portions of the conductive material higher than the top surface of the corresponding dielectric layer 38, leaving a metal line in the trench. In a dual damascene process, both a trench and a via opening are formed in one of dielectric layers 38, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Interconnect structure 32 includes top conductive (metal) features (denoted as 37) such as metal lines, metal pads, or vias in a top dielectric layer, which is in one of dielectric layers 38 (marked as dielectric layer 38A). In accordance with some embodiments, dielectric layer 38A is formed of a low-k dielectric material similar to the material of the lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 37 may also be formed of copper or a copper alloy, and may have a dual damascene structure or a single damascene structure. Dielectric layer 38A is sometimes referred to as a passivation layer.

Metal pads 42 are formed over and contacting metal feature 37. Metal pads 42 may be electrically coupled to integrated circuit devices 26 through interconnect structure 32 in accordance with some embodiments. Metal pads 42 may be aluminum pads or aluminum-copper pads, and other metallic materials may be used. In accordance with some embodiments of the present disclosure, metal pads 42 have an aluminum percentage greater than about 95 percent.

A patterned passivation layer 44 is formed over interconnect structure 32. Some portions of passivation layer 44 may cover the edge portions of metal pads 42, and the central portions of the top surfaces of metal pads 42 are exposed through openings 46 in passivation layer 44. Passivation layer 44 may be a single layer or a composite layer, and may be formed of a non-porous material. In accordance with some embodiments of the present disclosure, passivation layer 44 is a composite layer including a silicon oxide layer and a silicon nitride layer over the silicon oxide layer.

FIG. 1 further illustrates the formation of dielectric layer 48. In accordance with some embodiments of the present disclosure, dielectric layer 48 is formed of a polymer such as polyimide, polybenzoxazole (PBO), benzocyclobutene (BCB), or the like. In accordance with other embodiments, dielectric layer 48 is formed of an inorganic dielectric material such as silicon oxide, silicon nitride, silicon oxynitride, or the like. In subsequent discussion, dielectric layer 48 is referred to as polymer layer 48, while it can be formed of other materials. Polymer layer 48 is patterned, so that the central portions of metal pads 42 are exposed. Polymer layer 48 may be formed of a light-sensitive material (such as a photo resist), which may be a negative photo resist or a positive photo resist. The formation and the patterning of polymer layer 48 may include a light-exposure process and a development process. In accordance with some embodiments, after the development, polymer layer 48 covers the entire underlying portion of package component 20, except the portions wherein the underlying metal pads (such as 42) are to be revealed.

FIGS. 2 through 5 illustrate the formation of metal bumps and solder regions. In accordance with some embodiments, Redistribution Lines (RDLs, not shown) are formed before the formation of the metal bumps as shown in FIGS. 2 through 5 to electrically connecting metal pads 42 to the metal bumps. The formation of the RDLs includes depositing a blanket metal seed layer, which may be a copper layer, forming a patterned plating mask (not shown) on the blanket metal seed layer, plating the RDLs, removing the patterned plating mask, and etching the portions of the blanket metal seed layer previously covered by the patterned plating mask. The remaining portions of the metal seed layer and the plated material in combination form the RDLs, which include via portions extending into polymer layer 48 and trace portions over polymer layer 48. In accordance with alternative embodiments, the formation of the RDLs is skipped.

Figure 2:
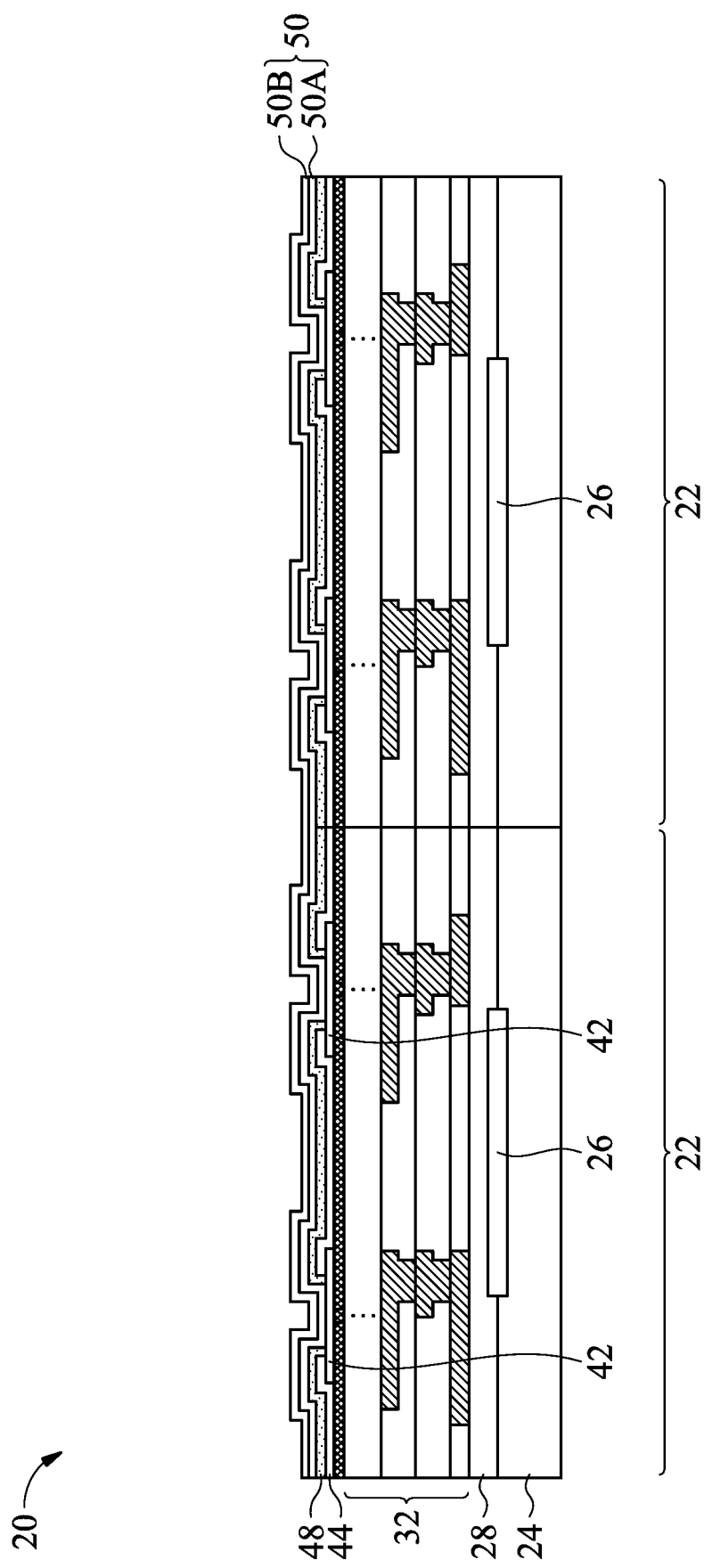

Next, as shown in FIG. 2, seed layer 50 is deposited over polymer layer 48. The respective process is illustrated as process 202 in the process flow shown in FIG. 24. Seed layer 50 is a conductive seed layer, and may be a metal seed layer. In accordance with some embodiments, seed layer 50 is a composite layer comprising a plurality of layers. For example, seed layer 50 may include a lower layer 50A and an upper layer 50B, wherein the lower layer 50A may include a titanium layer, a titanium nitride layer, a tantalum layer, a tantalum nitride layer, or the like. The materials of the upper layer 50B may include copper or a copper alloy. In accordance with alternative embodiments, seed layer 50 is a single layer, which may be a copper layer, for example. Seed layer 50 may be formed using Physical Vapor Deposition (PVD), while other applicable methods may also be used. Seed layer 50 extends into the openings in polymer layer 48.

Figure 3:
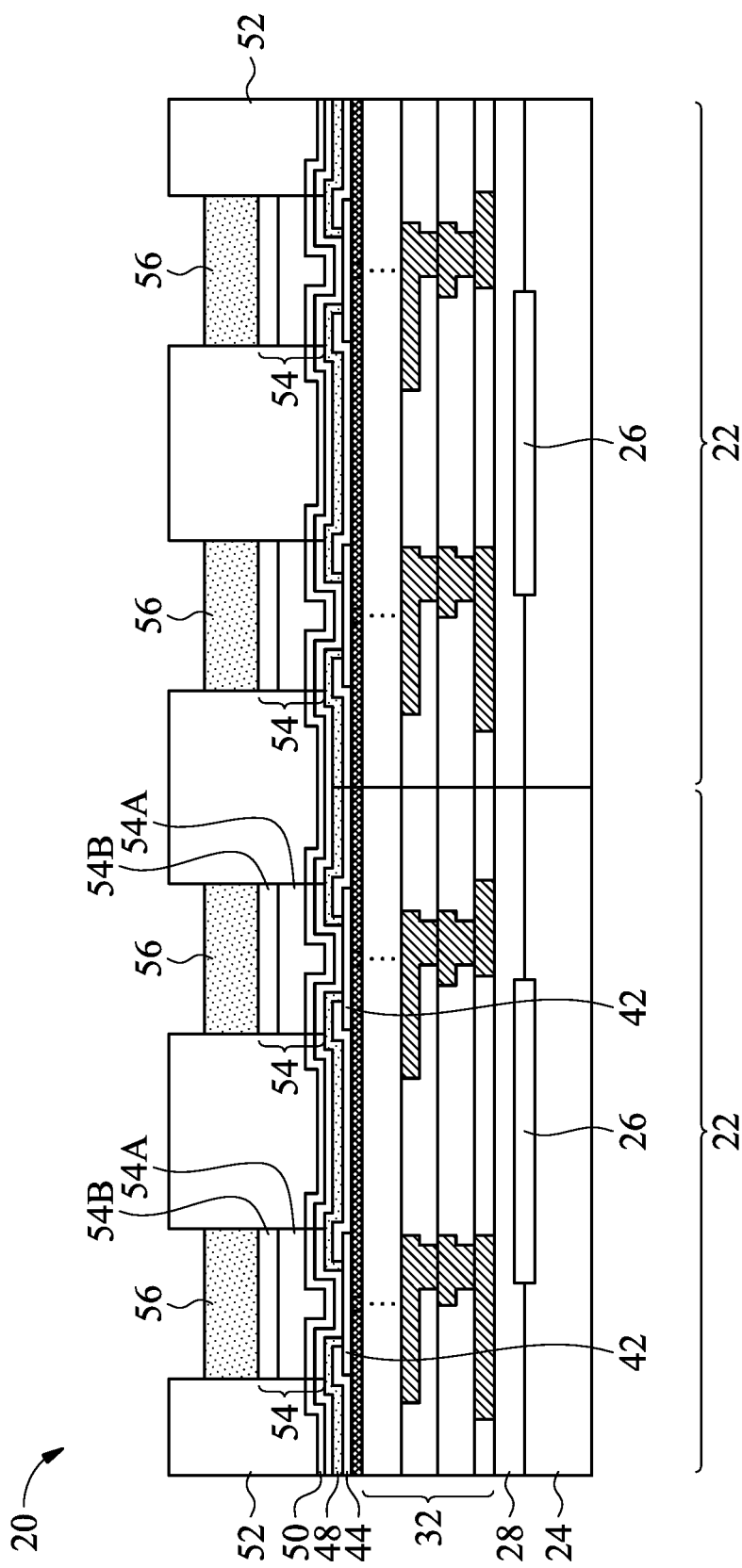

FIG. 3 illustrates the formation of plating mask 52. The respective process is illustrated as process 204 in the process flow shown in FIG. 24. In accordance with some embodiments, plating mask 52 is formed of a photo resist. Plating mask 52 is patterned to form openings, through which some portions of seed layer 50 are exposed.

Next, a plating process is performed to form metal bumps 54. The respective process is illustrated as process 206 in the process flow shown in FIG. 24. Metal bumps 54 may include one or a plurality of non-solder metal layers. For example, metal bumps 54 may include copper-containing layers 54A including copper or a copper alloy. Metal bumps 54 may also include metal cap layers 54B over copper-containing layers 54A. Metal caps 54B may be nickel-containing layers, palladium-containing layers, and/or the like, or the multi-layers thereof.

Figure 4:
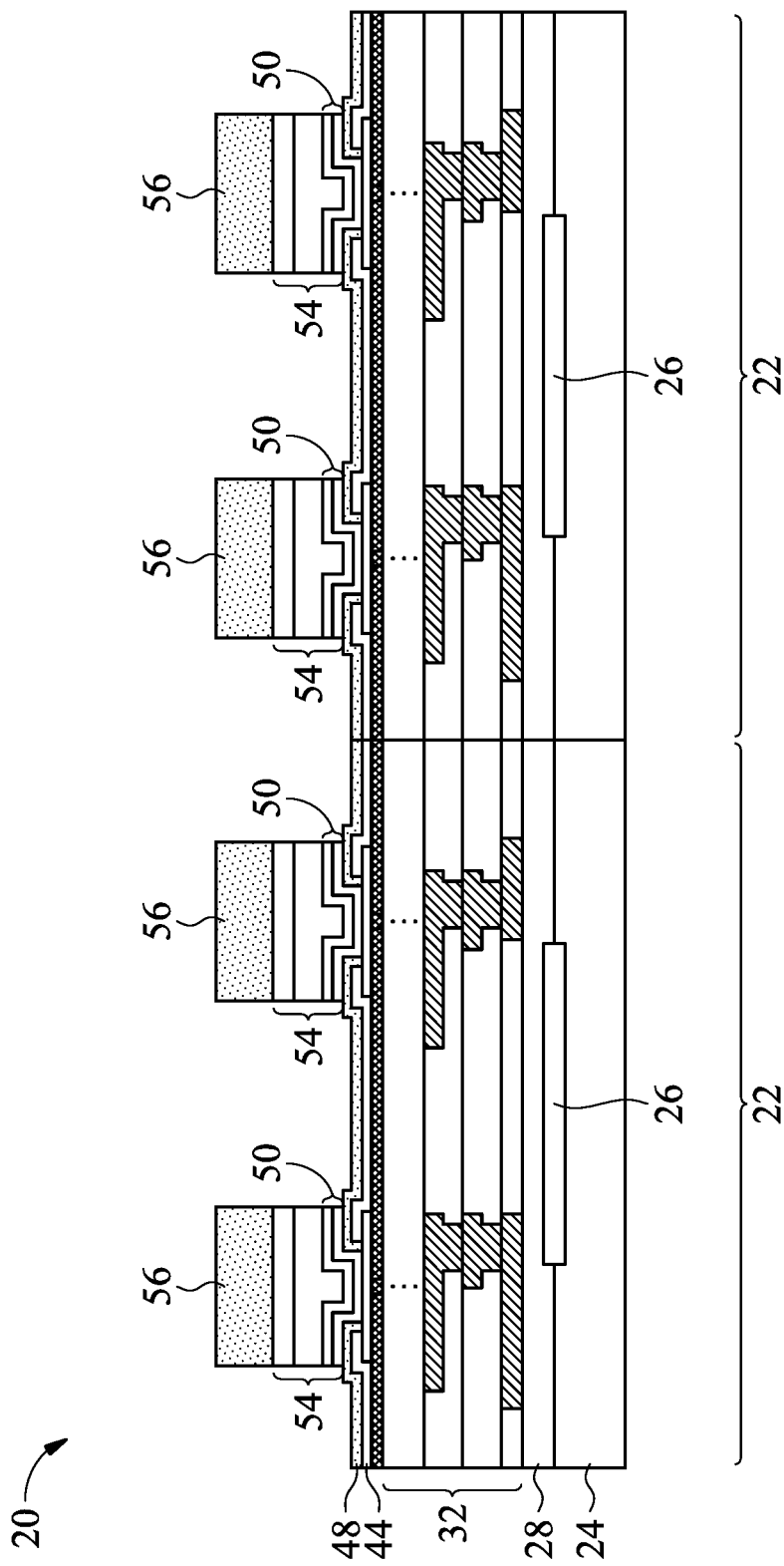

On top of metal bumps 54, solder regions 56 are formed by plating. Solder regions 56 may be formed of a Sn—Ag alloy, a Sn—Ag—Cu alloy, or the like, and may be lead-free or lead-containing. In a subsequent process, plating mask 52 is removed in a stripping process. For example, when plating mask 52 is formed of photo resist, plating mask 52 may be ashed using oxygen. Next, as shown in FIG. 4, the exposed portions of seed layer 50 that were previously covered by plating mask 52 are removed through etching, while the portions of seed layer 50 covered by metal bumps 54 remain un-removed. The respective processes are illustrated as processes 208 and 210 in the process flow shown in FIG. 24. The resulting structure is shown in FIG. 4. Throughout the description, the remaining portions of seed layer 50 are considered as being parts of the metal bumps 54. The sidewalls of the resulting metal bumps 54 may be substantially vertical. In a top view of package components 22, the metal bumps 54 therein may be arranged as an array or allocated in other repeated patterns.

Figure 5:
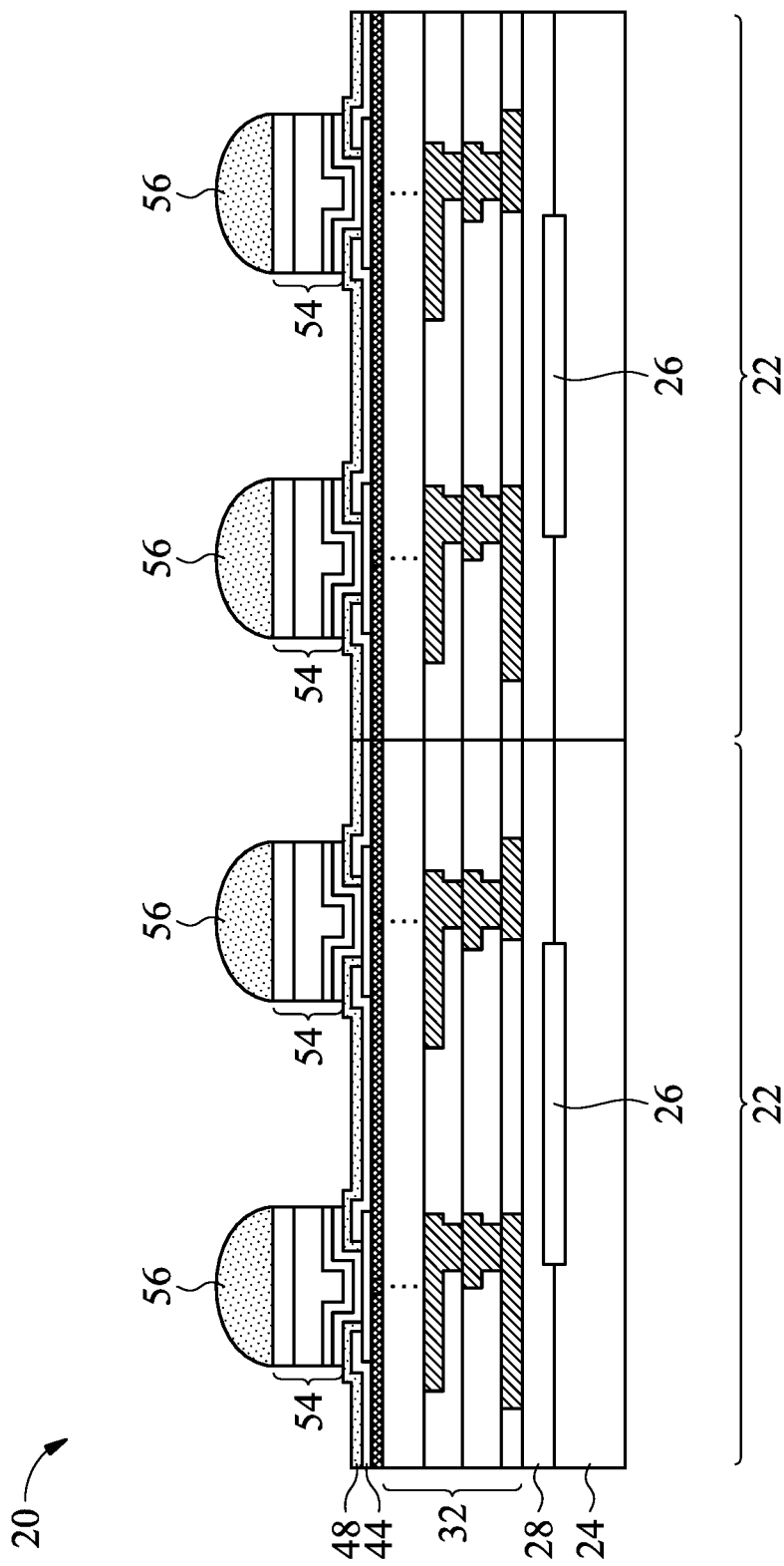

Referring to FIG. 5, solder regions 56 are reflowed in a reflow process, for example, in a convection reflow process, laser reflow process, or the like. Solder regions 56 thus have rounded surfaces.

Figure 6:
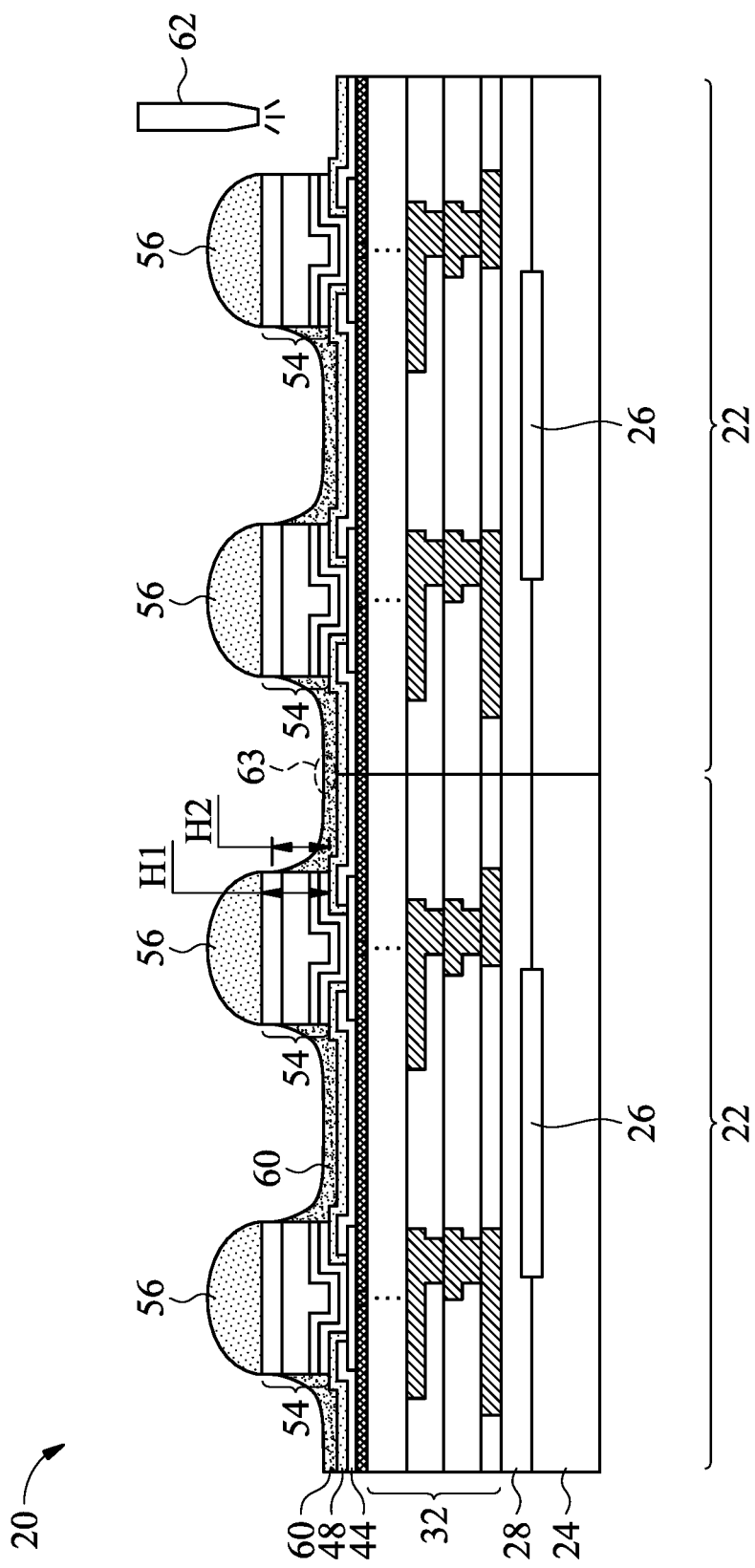

FIG. 6 illustrates the formation of protection layer 60, which is used to at least reduce, and possibly eliminate, the amount of solder flow/migrate to the sidewalls of the metal bumps 54. The respective process is illustrated as process 212 in the process flow shown in FIG. 24. Protection layer 60 covers and contacts the top surface of polymer layer 48, and include portions between metal bumps 54. In accordance with some embodiments of the present disclosure, the material of protection layer 60 is selected to be a dielectric material that is not wettable to solder. For example, protection layer 60 may be formed of a polymer such as polyimide, PBO, or the like. It has been found that polyimide has a high wettability to copper, and hence can easily spread on the whole sidewall surfaces of metal bumps 54, so that the benefit of the protection layer is increased. Protection layer 60 and polymer layer 48 may be formed of a same material such as polyimide or PBO, or may be formed of different materials, for example, with one being formed of PBO, and the other being formed of polyimide. Since polymer layer 48 and protection layer 60 are formed in different processes, the interface between polymer layer 48 and protection layer 60 may be distinguished regardless of whether they are formed of a same material or different materials. Protection layer 60 may also be formed of other materials such as epoxy. Protection layer 60 may be disposed as a flowable (aqueous) form when formed, and is then cured as a solid layer. Protection layer 60 does not include filler particles therein, and the entire protection layer 60 may be formed of a homogenous material. Making protection layer 60 to be free from filler particles allows protection layer 60 to have an improved flowability, so that it can climb on all sidewalls of metal bumps 54 without the need of disposing an excessive amount, and hence the risk of having protection layer 60 undesirably cover solder regions 56 is reduced or eliminated.

In accordance with some embodiments of the present disclosure, protection layer 60 is formed using a selective formation method such as inkjet printing, in which protection layer 60 is selectively sprayed to the spaces between metal bumps 54, but not on metal bumps 54. The inkjet printing may be achieved through a printing head 62. In accordance with some embodiments, the sprayed material is sprayed to the middle region between, and spaced apart from, neighboring metal bumps 54. The viscosity of protection layer 60 is low enough so that the sprayed material flows to contact the sidewalls of metal bumps 54. Furthermore, due to capillary action, the protection layer 60 climb onto upper portions the sidewalls of metal bumps 54. As a result, the portion of protection layer 60 between neighboring metal bumps 54 has a top surface lower than the top tips of the sidewall portions of protection layer 60 on the sidewalls of metal bumps 54, and lower than the interface between solder region 56 and metal bump 54. After the printing, protection layer 60 is cured. In the curing process, the top surface of protection layer 60 is a free surface that is not limited (such as pressed and/or contacted) by other features.

When protection layer 60 is formed using a selective formation method in which the regions on package component 20 can be selectively covered or not covered by protection layer 60, the scribe lines between neighboring package components 22 may be formed with protection layer 60, or may not be formed with protection layer 60. For example, region 63 may be disposed with, or not disposed with, protection layer 60.

The height of the sidewall of metal bumps 54 is denoted as H1. The height of the portion of protection layer 60 in contact with metal bumps 54 is denoted as H2. In accordance with some embodiments, protection layer 60 protects the majority of the sidewalls of metal bumps 54, and hence ratio H2/H1 is greater than 0.5. Ratio H2/H1 may be equal to 1.0, or in the range between 0.5 and about 1.0. When ration H2/H1 is smaller than 1.0, protection layer 60 is not in contact with the respective overlying solder region 56. Since the sidewalls of metal bumps 54 are wettable to solder, and protection layer 60 is not wettable to solder, when protection layer 60 covers the entire sidewalls of metal bumps 54, the entire wettable surfaces of metal bumps 54 are covered by non-solder-wettable surfaces. This provides the improved benefit of preventing solder from migrating (or flowing) to the sidewalls of metal bumps 54. Due to process variations, protection layer 60 may climb to different heights. For example, some portions of protection layer 60 may climb to the interface between solder regions 56 and metal bumps 54, while some other portions of protection layer 60 may climb to an intermediate height between the top surfaces and the bottom surfaces of the corresponding copper-containing layer 54A or the intermediate height between the top surfaces and the bottom surfaces of the corresponding capping layer 54B.

As a result of the spray, flow, and capillary action, in a gap between two neighboring metal bumps 54, the respective portion of protection layer 60 may have a top surface that is lowest at a point close to the middle of the gap, and the levels of the top surfaces of the portions of protection layer 60 closer to metal bumps 54 are higher than the levels of the top surfaces of the portions of protection layer 60 farther away from metal bumps 54. Furthermore, the top surface of the respective portion of protection layer 60 may be continuously curved, as illustrated in an example. The resulting structure with protection layer 60 is shown in FIG. 9.

Figure 7:
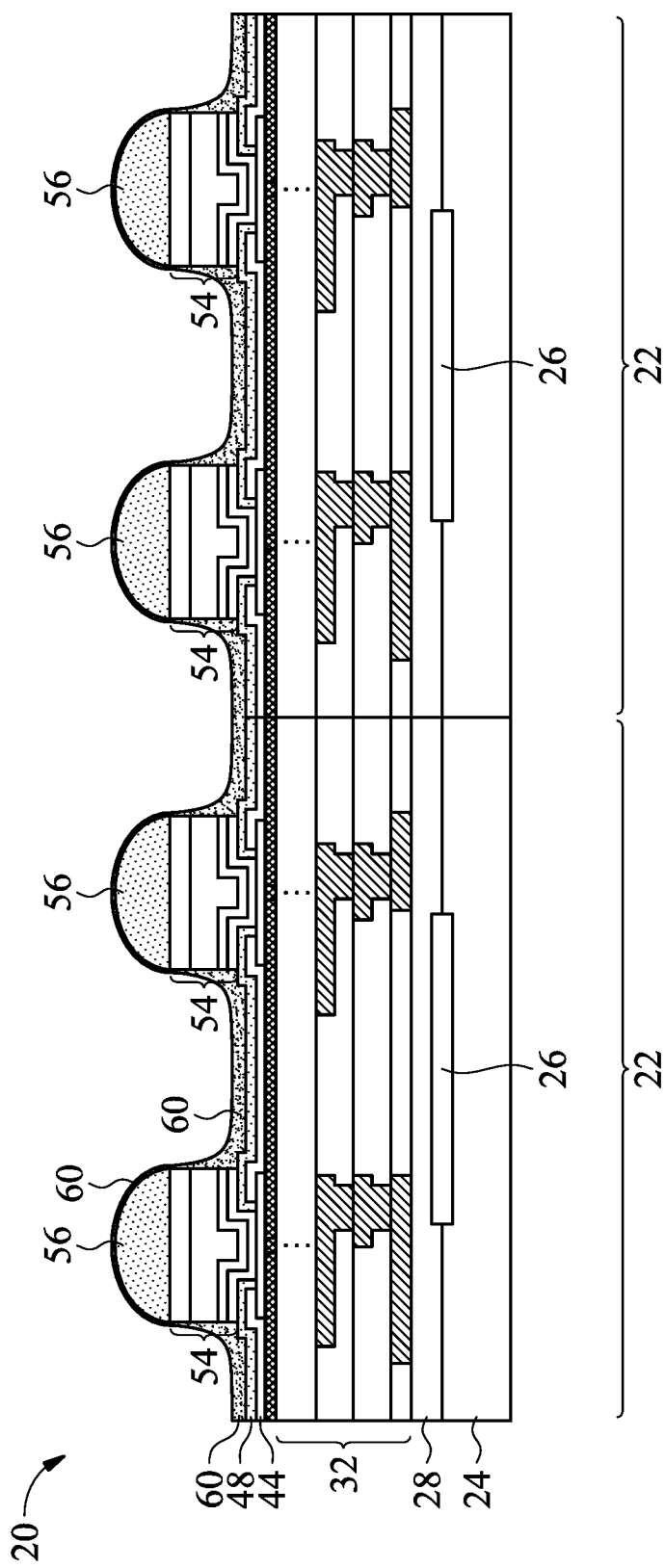
Figure 8:
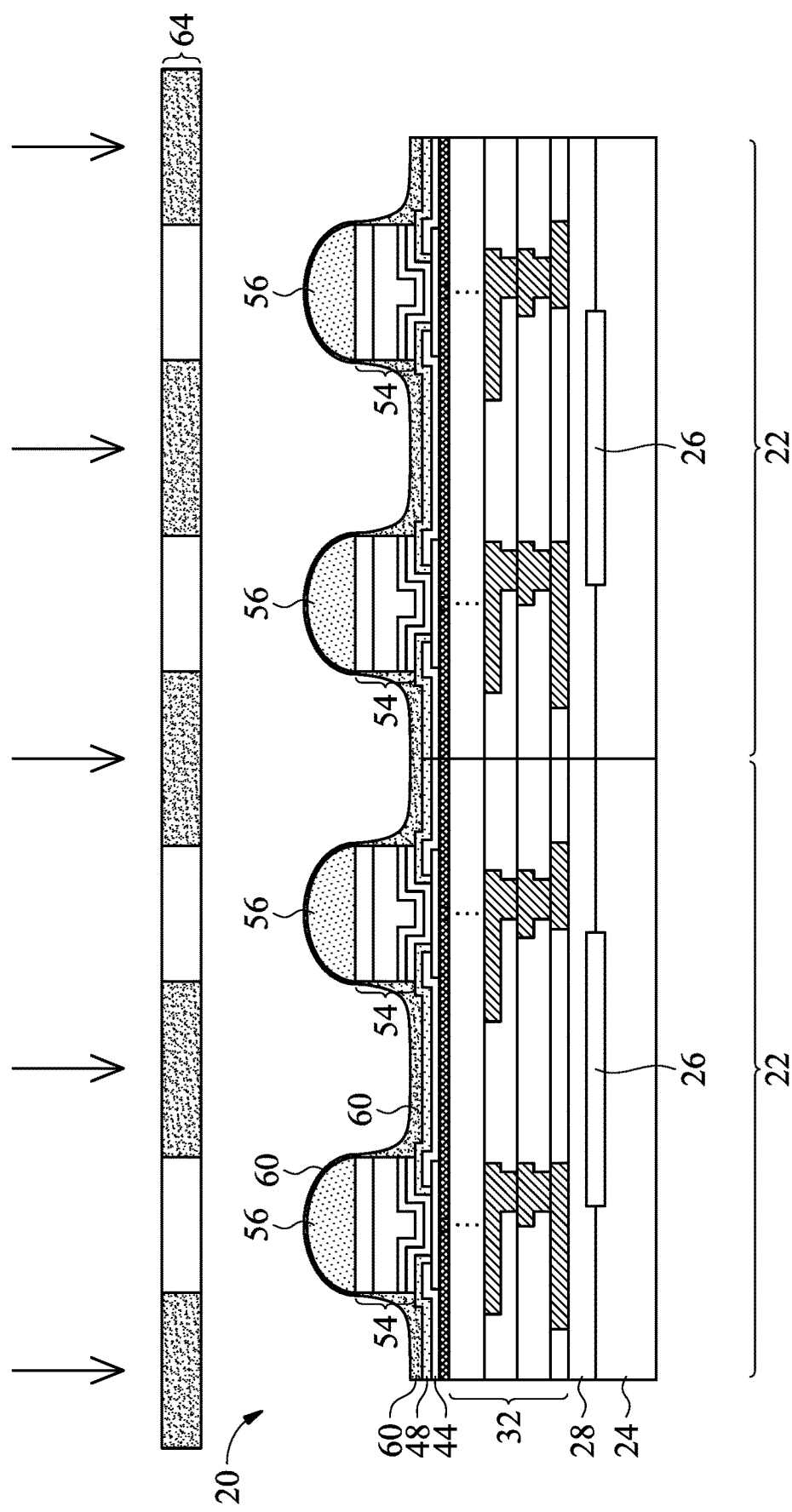

FIGS. 7 and 8 illustrate the formation of protection layer 60 in accordance with alternative embodiments. Referring to FIG. 7, protection layer 60 is coated, for example, through spin-on coating. Protection layer 60 includes some portions in the gaps between neighboring metal bumps 54, and some other portions on the surfaces of solder regions 56. In accordance with some embodiments, protection layer 60 is formed of a light-sensitive material such as polyimide, PBO, or the like.

Next, as shown in FIG. 8, a lithography mask 64, which includes opaque portions for blocking light and transparent portions for allowing the light to pass through, is used to perform a light-exposure on protection layer 60. Protection layer 60 may be a positive photo resist or a negative photo resist, and hence either the portions of protection layer 60 on solder regions 56 are light-exposed, or the portions of protection layer 60 not on metal bumps 54 are light-exposed. After the light-exposure, a development process is performed, so that the portions of protection layer 60 on solder regions 56 are removed. The resulting structure is shown in FIG. 9.

Figure 9:
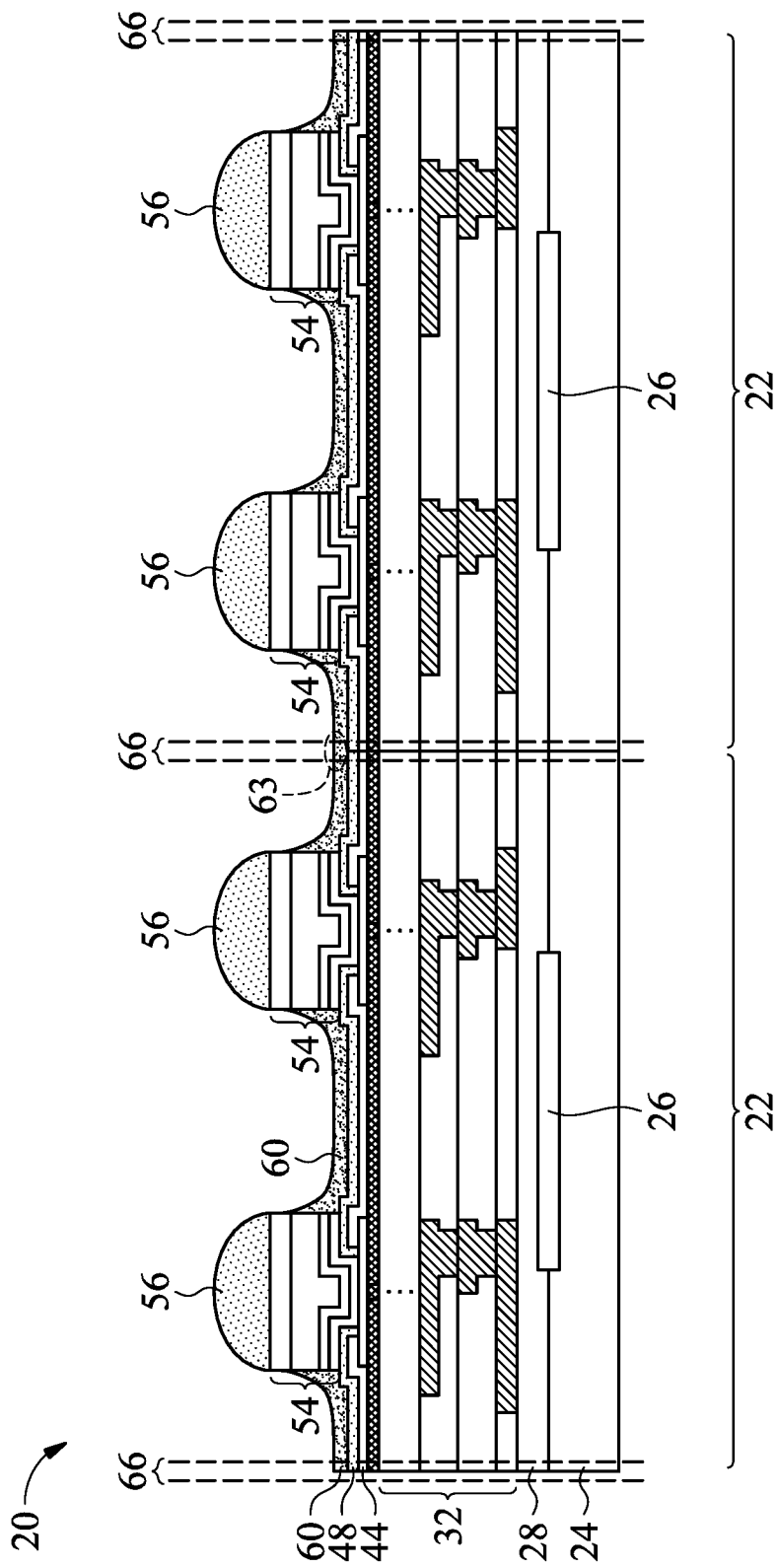

FIG. 9 also illustrates the singulation (die-saw) process of package component 20, which is singulated along scribe lines 66. The respective process is illustrated as process 214 in the process flow shown in FIG. 24. Chips 22 (which are referred to as dies 22 or package components 22) are thus separated from each other. Since protection layer 60 may or may not exist in scribe lines 66 (as shown by regions 63 that may be free from protection layer 60), in the singulation process, the blade used for the singulation may pass through the space between the portions of protection layer 60 in neighboring package components 22, but does not cut through protection layer 60. The blade may also cut through protection layer 60 if protection layer 60 extends into scribe lines 66.

Figure 10:
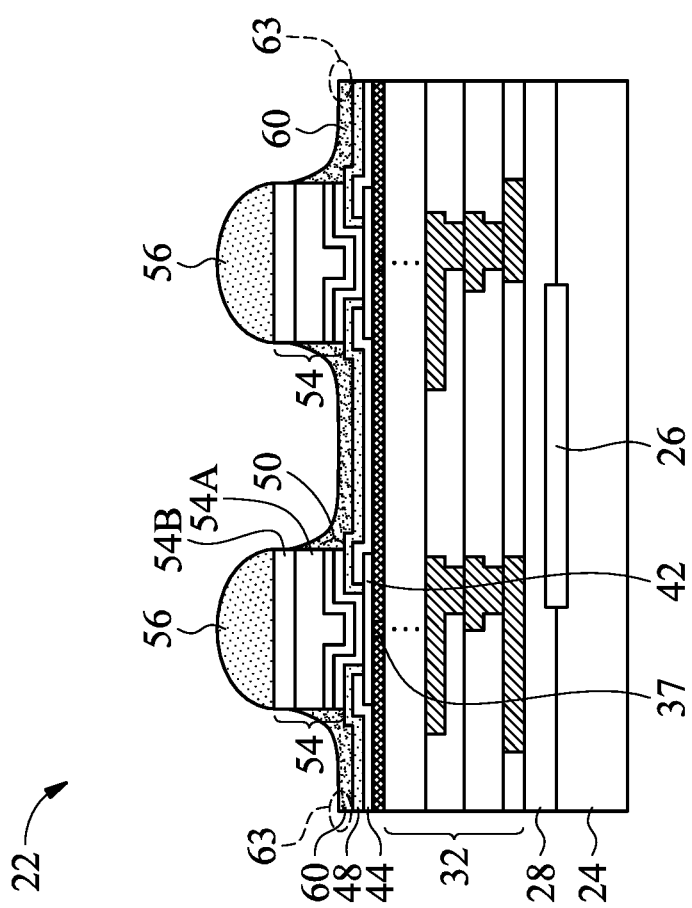

FIG. 10 illustrates one of package components 22 in accordance with some embodiments. Regions 63 may or may not include protection layer 60. In accordance with some embodiments, in a top view of package component 22, regions 63 that are free from protection layer 60 may form a continuous full ring encircling protection layer 60. Alternatively stated, protection layer 60 may (or may not) laterally recessed from all edges of package component 22.

FIGS. 11 through 19 illustrate the formation of wafer-level package component 70 in accordance with some embodiments. In accordance with some embodiments, package component 70 is an interposer wafer, which is free from active devices, and may or may not include passive devices. In accordance with other embodiments, package component 70 is device wafer, which includes circuits 80 therein. Circuit 80 may include active devices such as transistors and diodes, passive devices such as capacitors, resistors, inductors, or the like. Circuits 80 are shown using dashed lines to indicate it may or may not be formed. Package component 70 may include substrate 72, and through-via 74 (sometimes referred to as through-silicon vias or through-substrate vias) extending into substrate 72. In accordance with some embodiments of the present disclosure, substrate 72 is a semiconductor substrate, which may be a silicon substrate, a silicon germanium substrate, a silicon carbide substrate, a III-V compound substrate, or the like. When substrate 72 is formed of a semiconductor material, through-vias 74 are encircled by dielectric rings, which electrically insulate through-vias 74 from substrate 72. In accordance with some embodiments of the present disclosure, substrate 72 is a dielectric substrate formed of, for example, silicon oxide, silicon nitride, or the like. Through-vias 74 extend to an intermediate level between a top surface and a bottom surface of substrate 72. Through-vias 74 are conductive. In accordance with some embodiments, through-vias 74 extend into dielectric layer 78, which is over substrate 72. It is appreciated that there may be (or may not be) a plurality of dielectric layers between dielectric layer 78 and substrate 72, with metal lines and vias formed in the dielectric layers to connect to through-vias 74 and integrated circuit devices 80. Furthermore, the top surfaces of through-vias 74 may be level with the top surface of dielectric layer 78, or may be level with the top surface of any dielectric layer over substrate 72.

Package component 70 includes package components 71, which are parts of the un-sawed wafer-level component 70. Package components 71 may be device dies, interposer dies, or the like. In accordance with some embodiments, package components 71 are Central Processing Unit (CPU) die, Application Processor (AP) dies or another type of logic dies. Integrated circuit devices 80 (if formed), which include transistors, diodes, capacitors, resistors, and/or the like, are formed at a surface of substrate 72.

Figure 11:
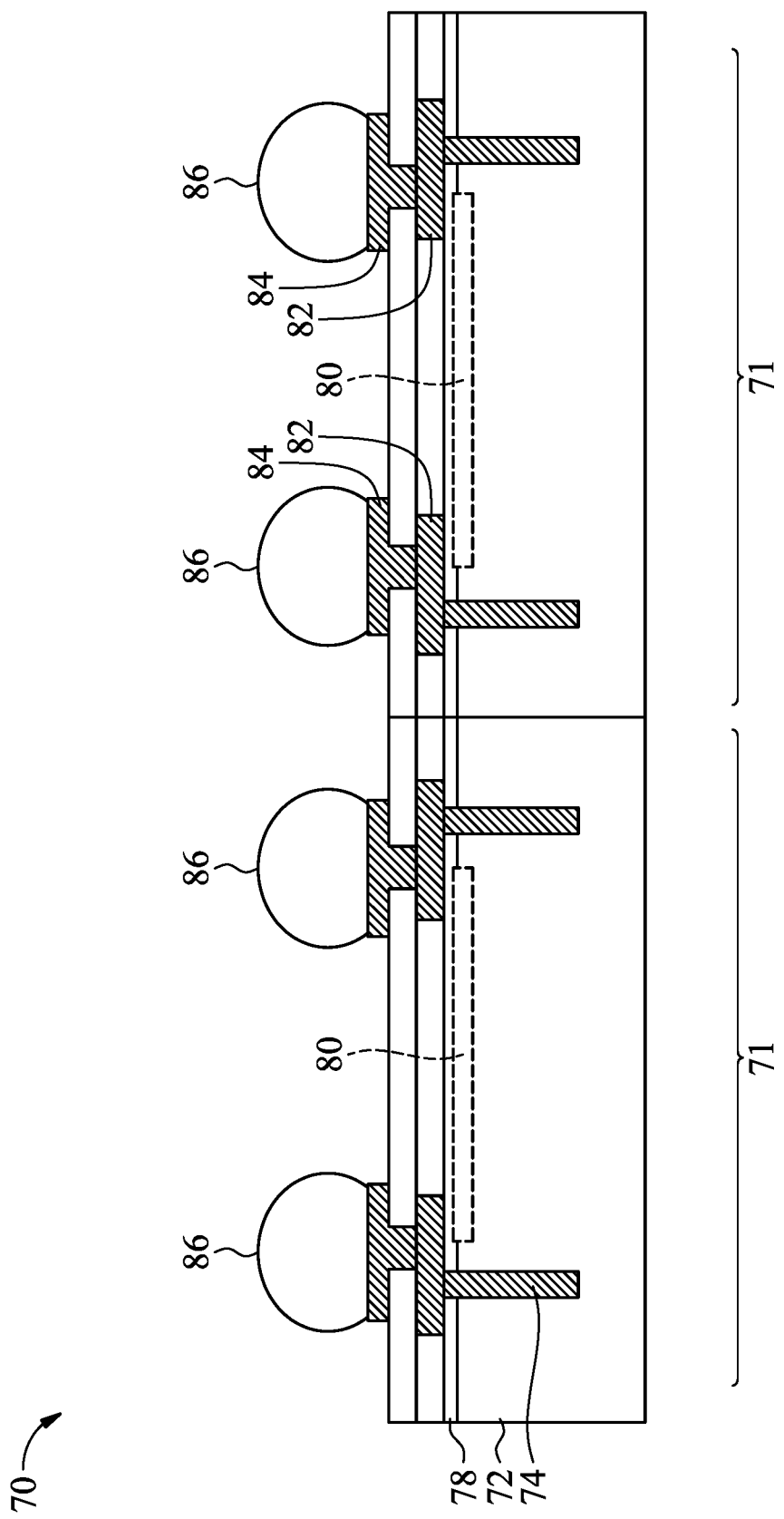
FIGS. 11 through 19 illustrate the cross-sectional views of intermediate stages in the formation of a wafer including protection layers on the sidewalls of metal bumps in accordance with some embodiments.

RDLs 82 (sometimes referred to as metal lines and vias) are formed over dielectric layer 78, and are electrically coupled to through-vias 74. UBMs 84 are formed over and electrically coupling to RDLs 82. Solder regions 86 are formed on UBMs 84. In accordance with some embodiments, solder regions 86 are formed on the front side of package component 70, as illustrated in FIG. 11. In accordance with alternative embodiments, solder regions are formed on the backside of package component 70, and metal bumps (FIG. 19) are formed on the front side of package component 70. Throughout the description, the front side is the side circuits 80 are formed, and/or the side from which through-vias 74 extend into substrate 72.

Figure 12:
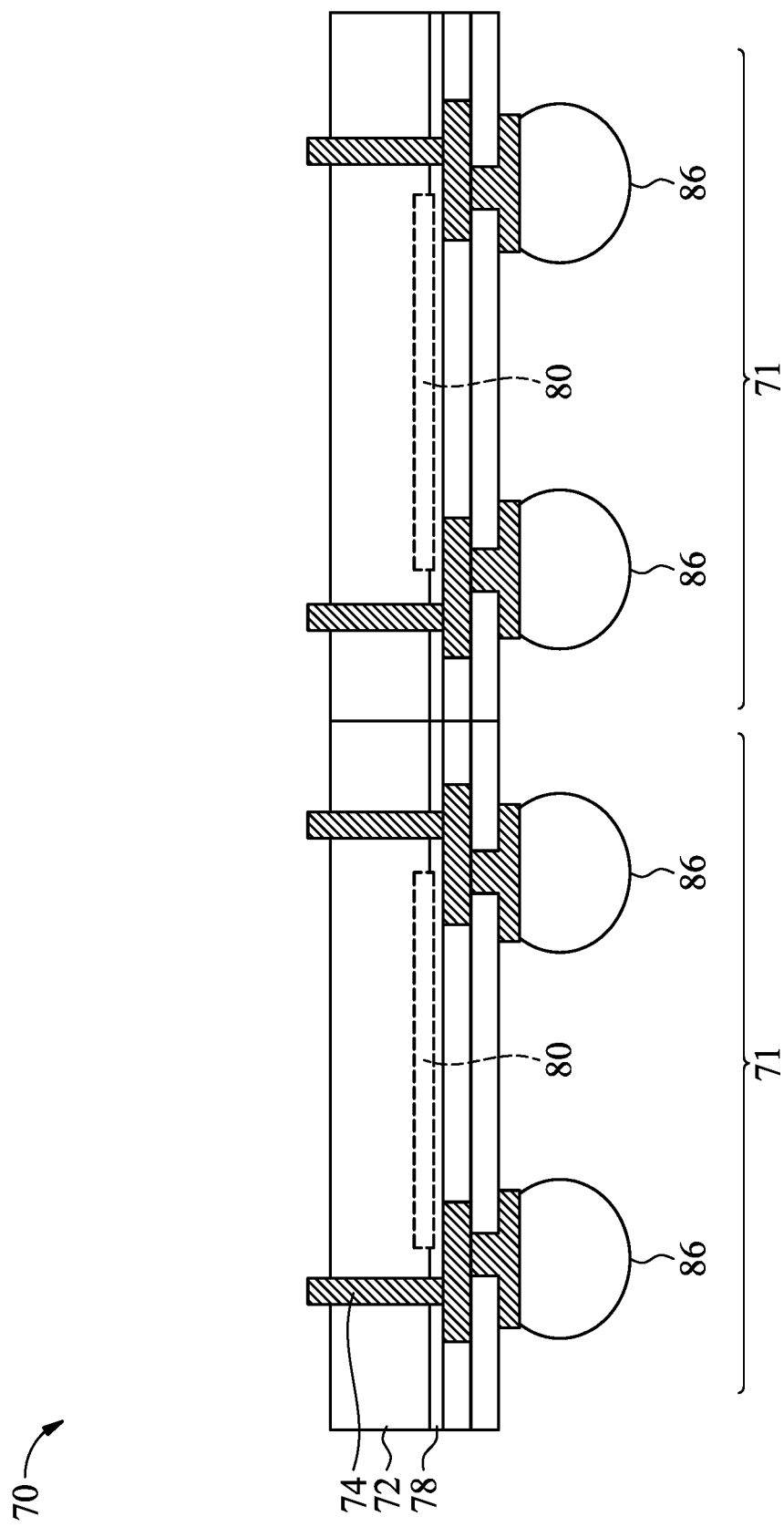
Figure 13:
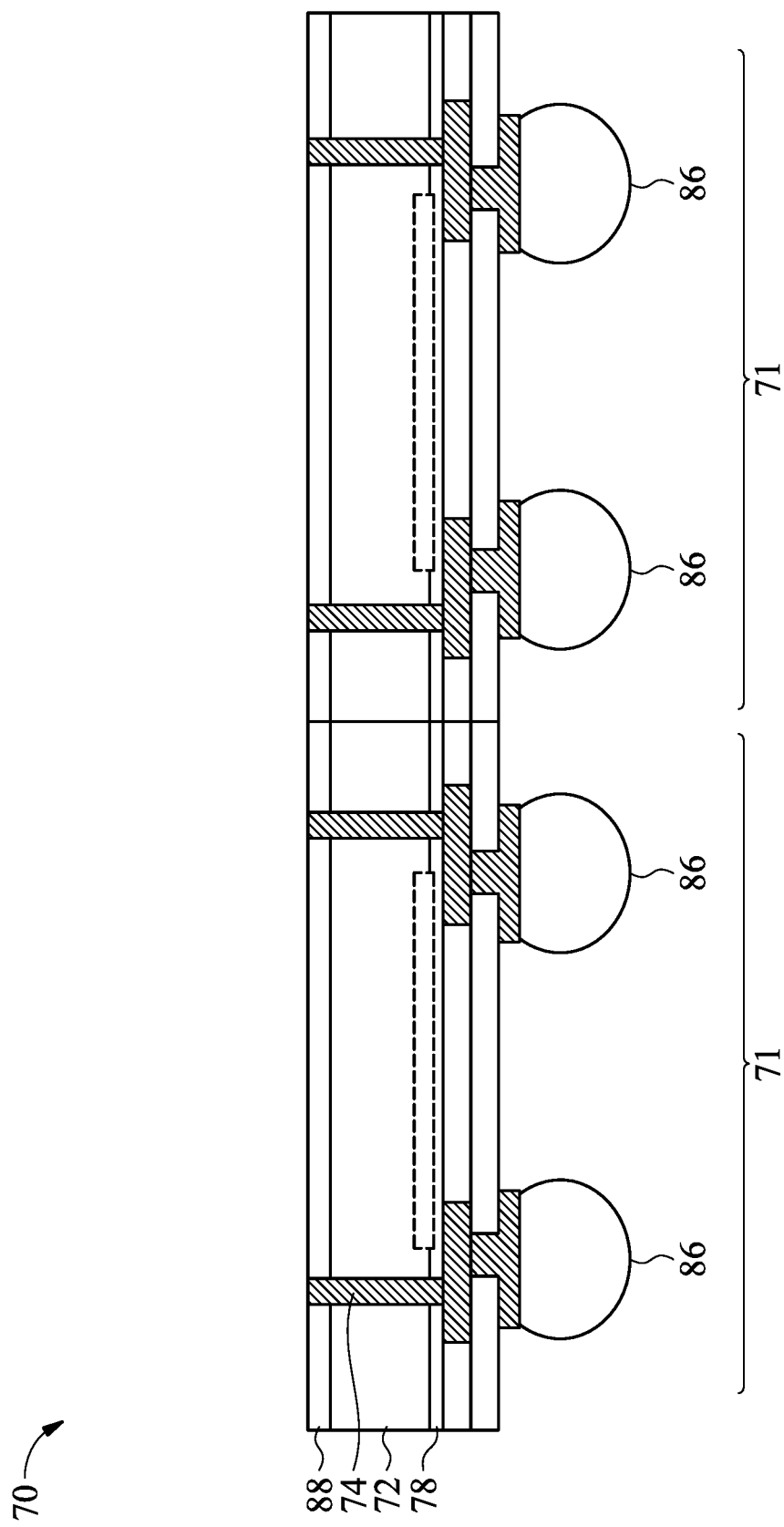
Figure 14:
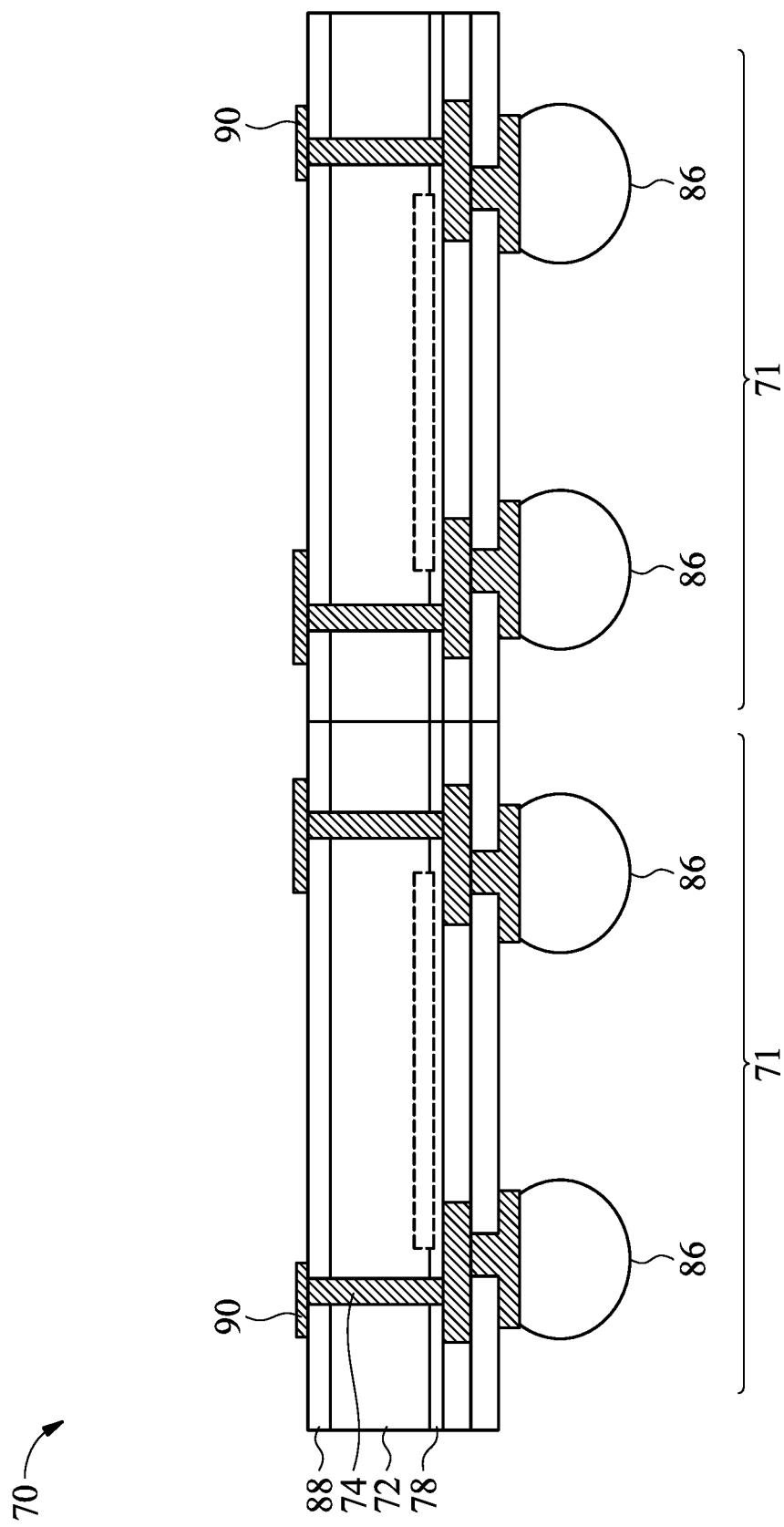

Referring to FIG. 12, a backside grinding process is performed to remove a portion of substrate 72, until through-vias 74 are revealed. The respective process is illustrated as process 216 in the process flow shown in FIG. 24. Next, substrate 72 may be recessed slightly (for example, through etching), so that through-vias 74 protrude out of the surface of substrate 72. The respective process is illustrated as process 218 in the process flow shown in FIG. 24. Next, a dielectric layer 88 is deposited, followed by a CMP process or a mechanical grinding process to re-expose through-vias 74. Dielectric layer 88 is thus formed, with through-vias 74 penetrate through dielectric layer 88, as shown in FIG. 13. The respective process is illustrated as process 220 in the process flow shown in FIG. 24. In accordance with some embodiments, dielectric layer 88 is formed of silicon oxide, silicon nitride, or the like. FIG. 14 illustrates the formation of RDLs 90, which include pad portions directly over and in contact with through-vias 74. RDLs 90 may be formed of aluminum, copper, nickel, titanium, or the like. The respective process is illustrated as process 222 in the process flow shown in FIG. 24.

Figure 15:
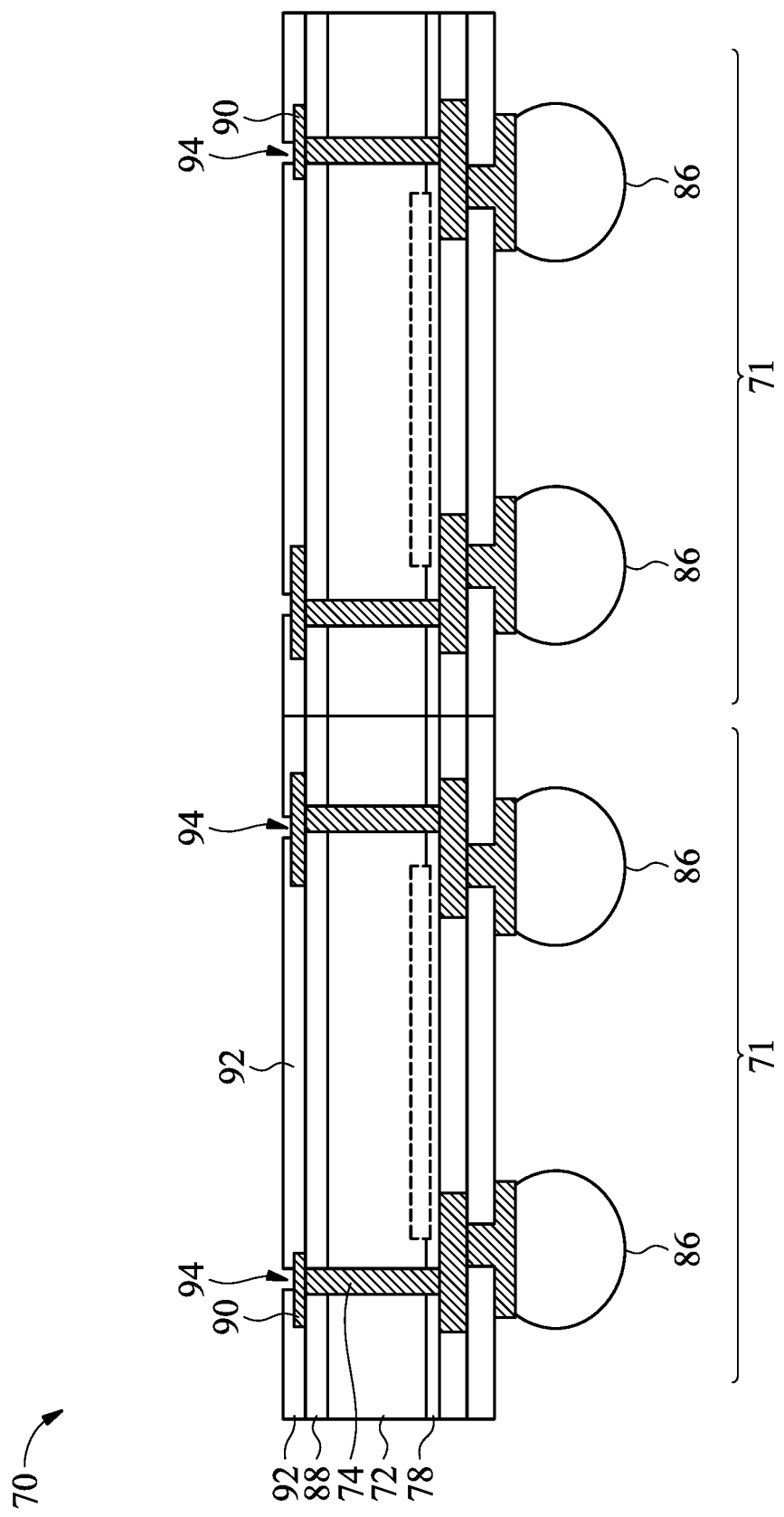
Figure 16:
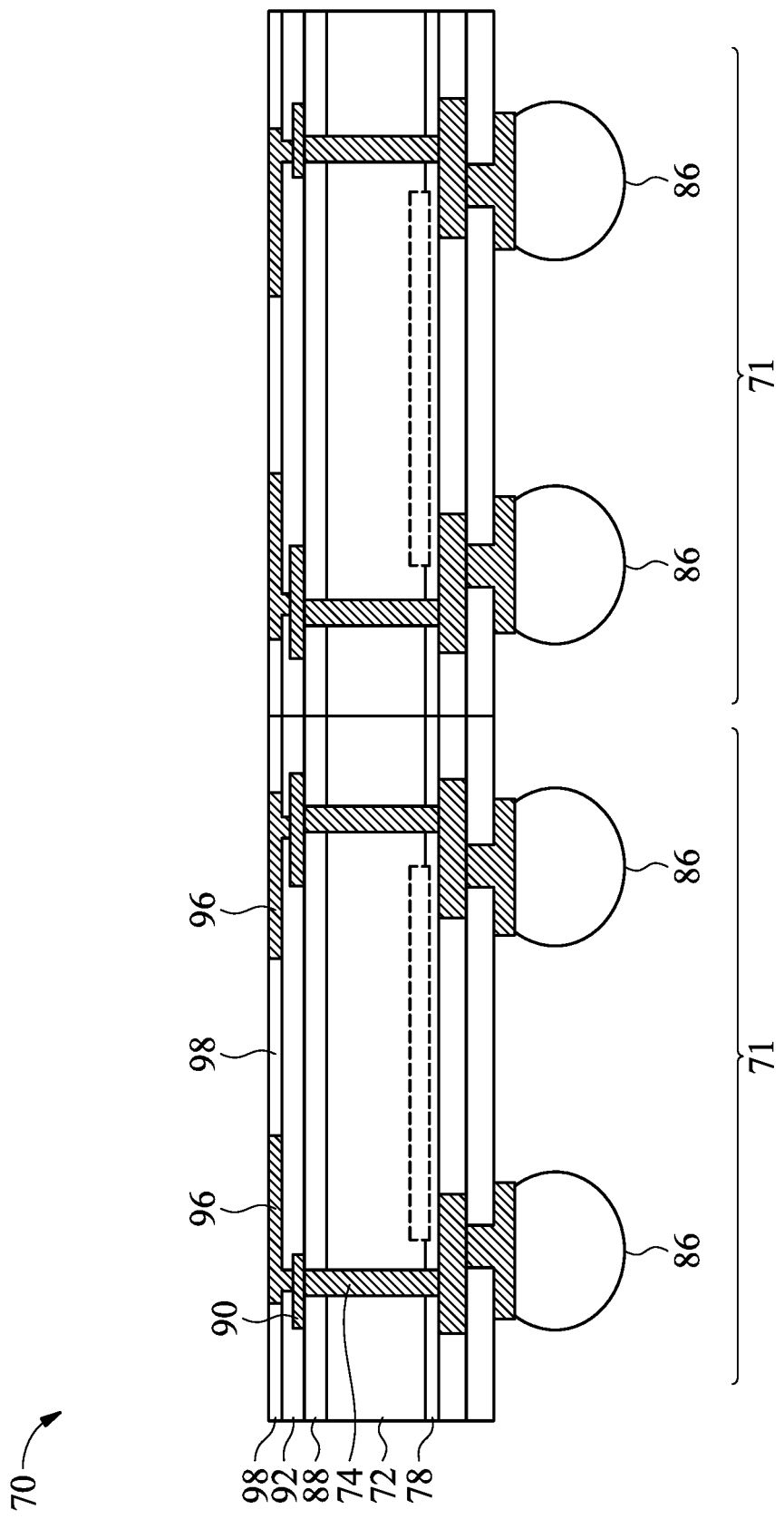

FIGS. 15 and 16 illustrate the formation of dielectric layer 92 and RDLs 96, respectively. Referring to FIG. 15, dielectric layer 92 is formed. In accordance with some embodiments of the present disclosure, dielectric layer 92 is formed of a light-sensitive polymer such as PBO, polyimide, or the like. In accordance with alternative embodiments of the present disclosure, dielectric layer 92 is formed of an inorganic material such as silicon nitride, silicon oxide, or the like. Dielectric layer 92 is patterned, for example, using a photo lithography process, so openings 94 are formed to reveal RDLs 90.

Referring to FIG. 16, RDLs 96 are formed to electrically connect to RDLs 90. In accordance with some embodiments of the present disclosure, the formation of RDLs 96 includes depositing a blanket metal seed layer, forming a patterned plating mask (not shown) over the blanket metal seed layer, plating RDLs 96 in the openings in the blanket metal seed layer, removing the plating mask, and etching the portions of the metal seed layer previously covered by the plating mask. In accordance with alternative embodiments, RDLs 96 are formed using a damascene process, and is formed in dielectric layer 98. The top surfaces of RDLs 96 may be level with the top surface of dielectric layer 98, or alternatively, RDLs 96 may include some portions over dielectric layer 98.

Figure 17:
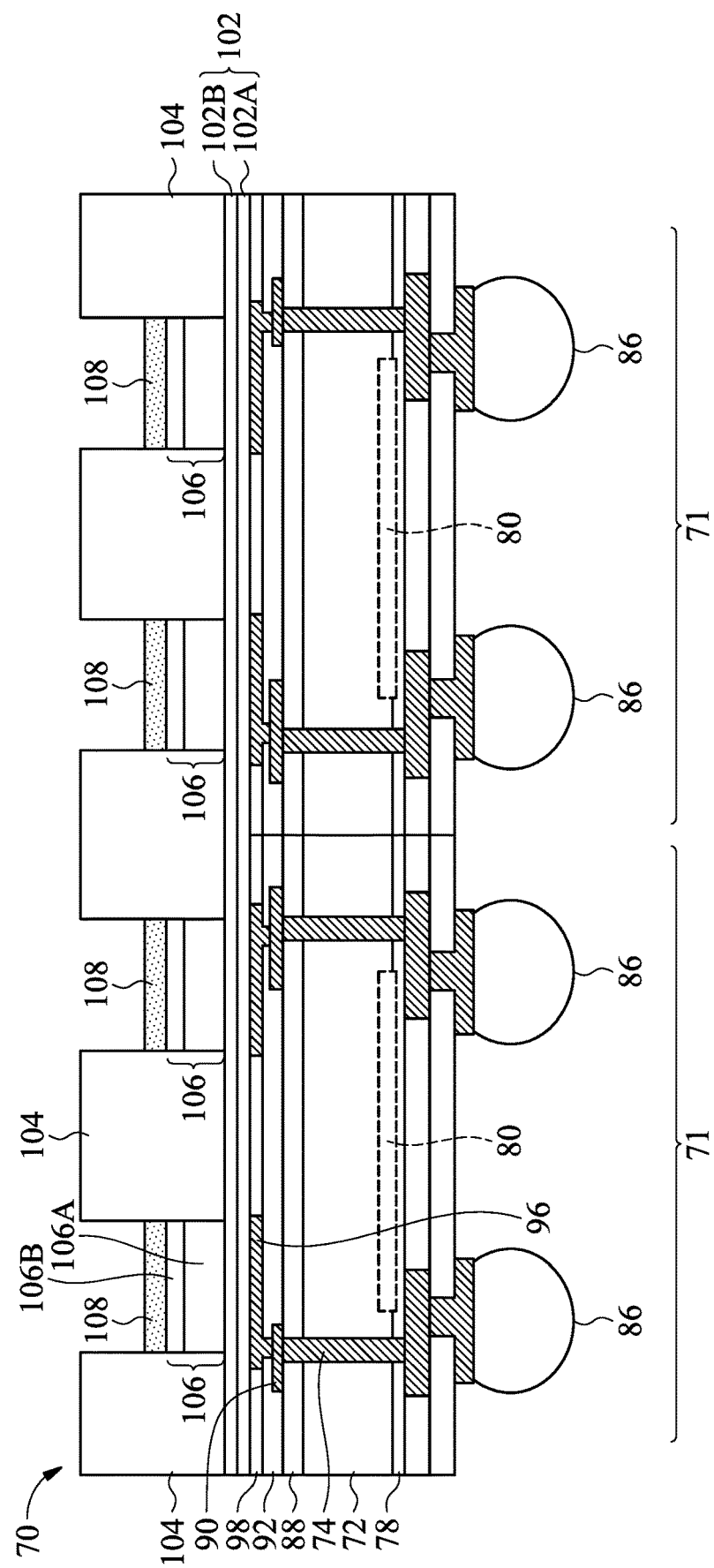

FIG. 17 illustrates the formation of metal seed layer 102. In accordance with some embodiments, metal seed layer 102 has a multi-layer structure including lower layer 102A and upper layer 102B. The material of layers 102A and 102B may be similar to that of layers 50A and 50B (FIG. 2), respectively, in seed layer 50. For example, lower layer 102A may be formed of titanium, and upper layer 102B may be formed of copper. The formation method includes PVD or the like. Next, plating mask 104 is formed and patterned to reveal some portions of metal seed layer 102.

Figure 18:
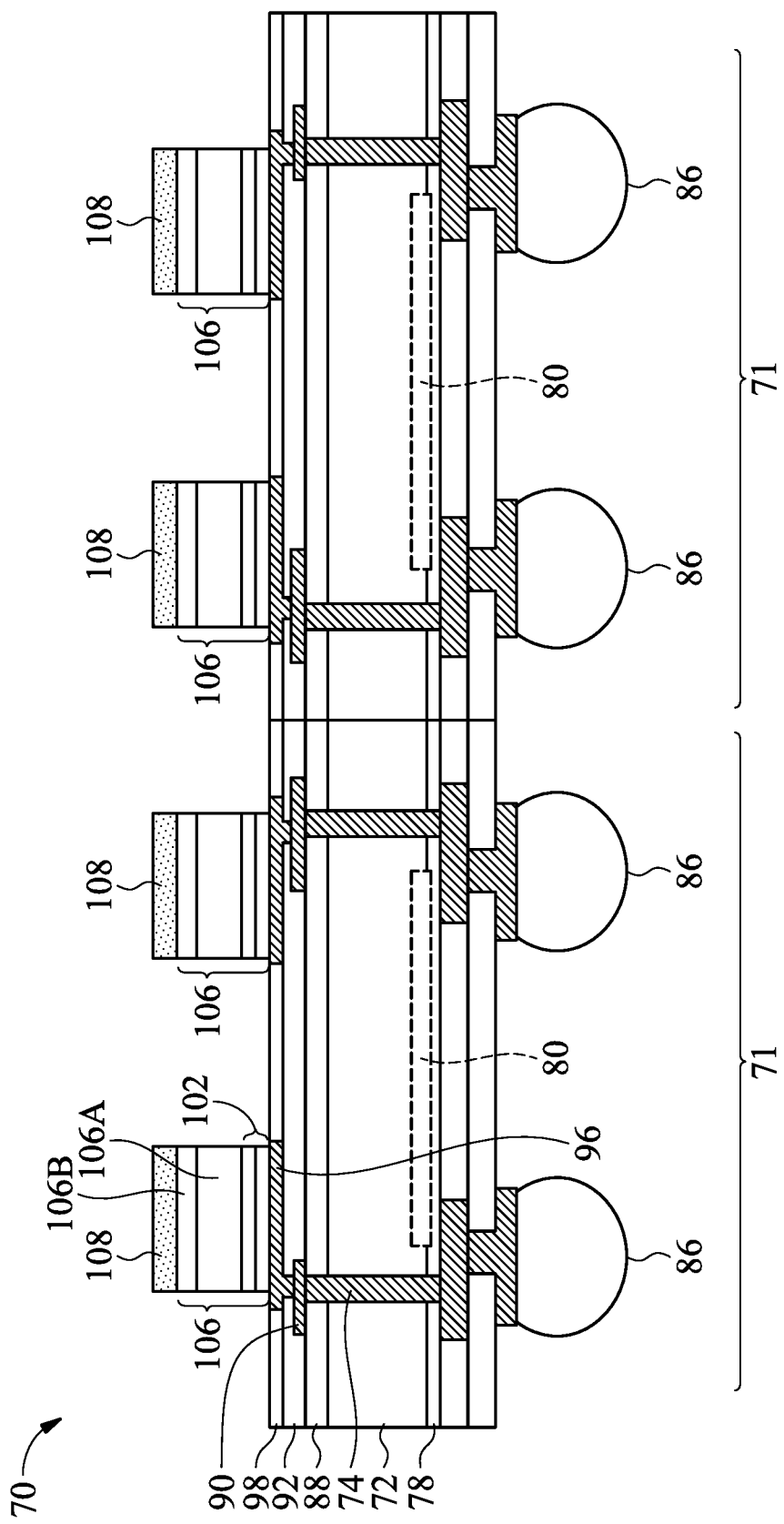

Further referring to FIG. 17, metal bumps 106 and solder regions 108 are formed through plating. The respective process is illustrated as process 224 in the process flow shown in FIG. 24. In accordance with some embodiments, metal bumps 106 are formed of non-reflowable (non-solder) metallic materials. For example, layers 106A in metal bumps 106 may be formed of copper, and capping layers 106B in metal bumps 106 may be formed of nickel. After the plating of solder regions 108, plating mask 104 is removed, for example, in an ashing process, revealing the underlying portions of metal seed layer 102. The exposed portions of metal seed layer 102 are then etched. Throughout the discussion, the remaining portions of metal seed layer 102 are also considered as being parts of metal bumps 106. The resulting package component 70 is shown in FIG. 18. In accordance with some embodiments, no reflow is performed on package component 70.

Figure 19:
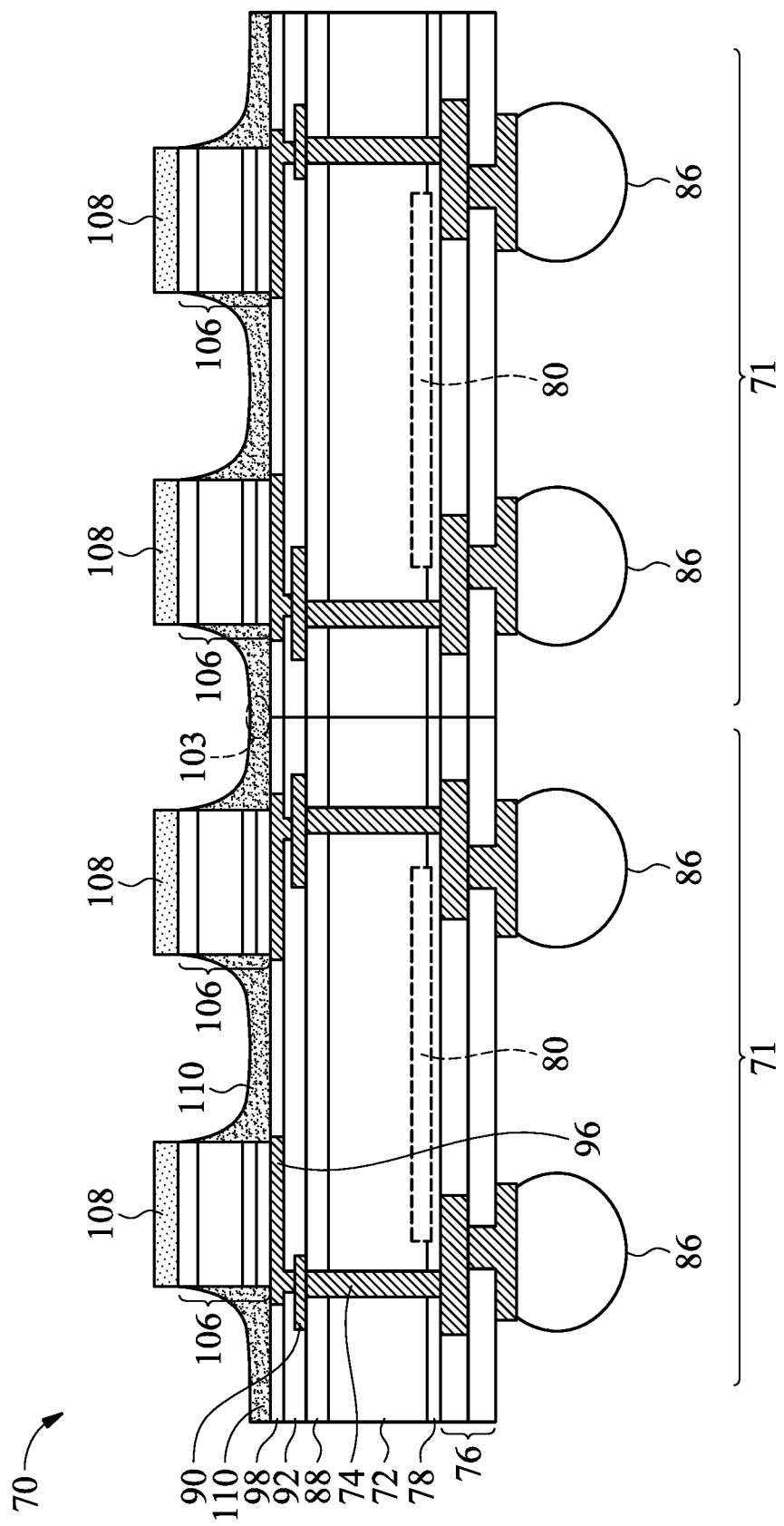

FIG. 19 illustrates the formation of protection layer 110. The respective process is illustrated as process 226 in the process flow shown in FIG. 24. The material, the formation method, and the structure of protection layer 110 may be selected from the candidate materials, the candidate formation methods, and the candidate structures of protection layer 60, which is discussed referring to FIGS. 6 through 8. Protection layer 110 covers the sidewalls of metal bumps 106. The heights of protection layer 110 relative to the heights of metal bumps 106 may be similar to the relationship of the heights of protection layer 60 (FIG. 6) relative to the heights of metal bumps 54. Protection layer 110 may or may not be formed in the scribe lines between neighboring package components 71. For example, protection layer 110 may or may not be formed in region 103.

Figure 20:
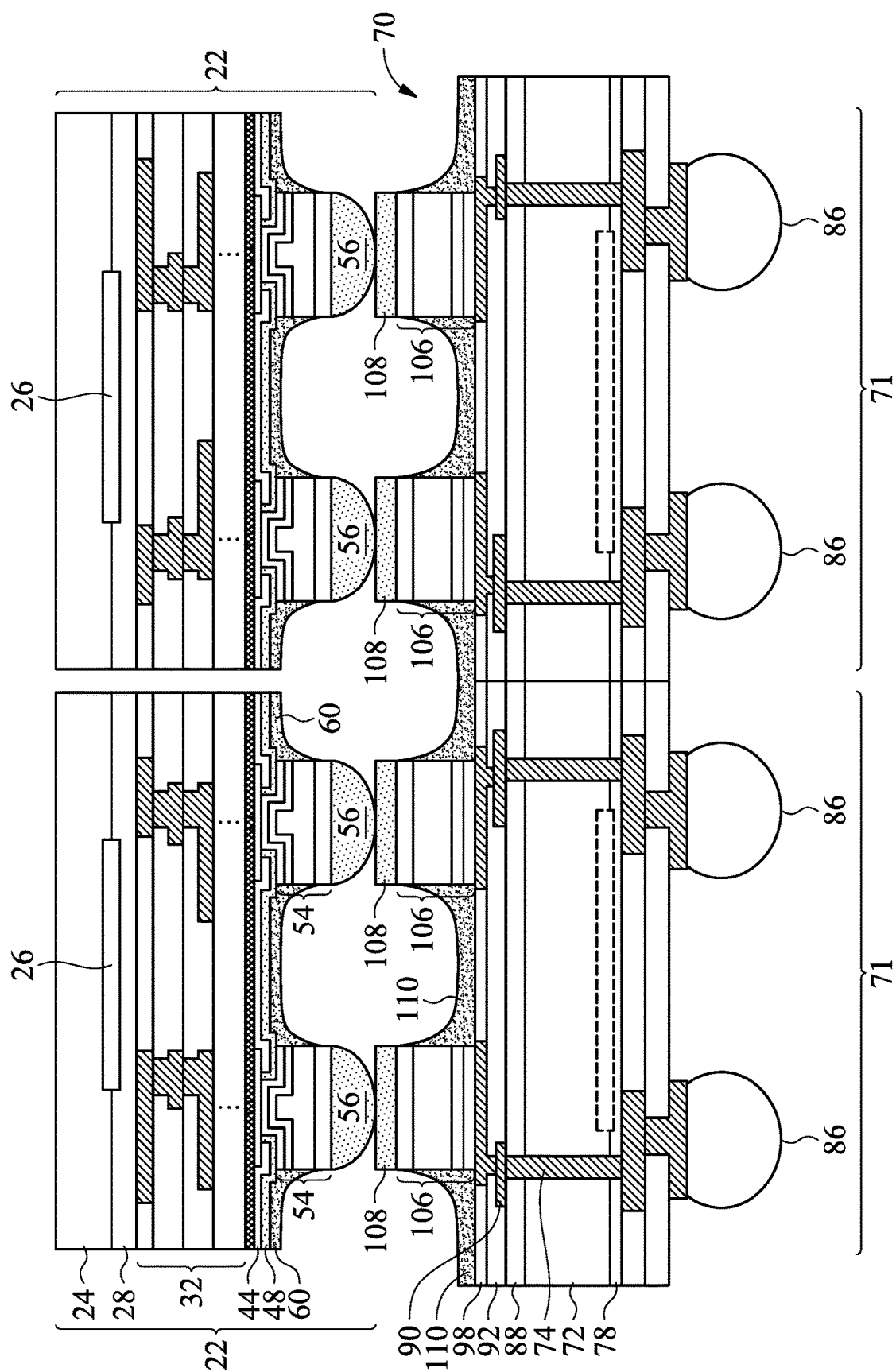
FIGS. 20 through 23 illustrate the cross-sectional views of intermediate stages in the bonding of package components to a wafer in accordance with some embodiments.
Figure 21:
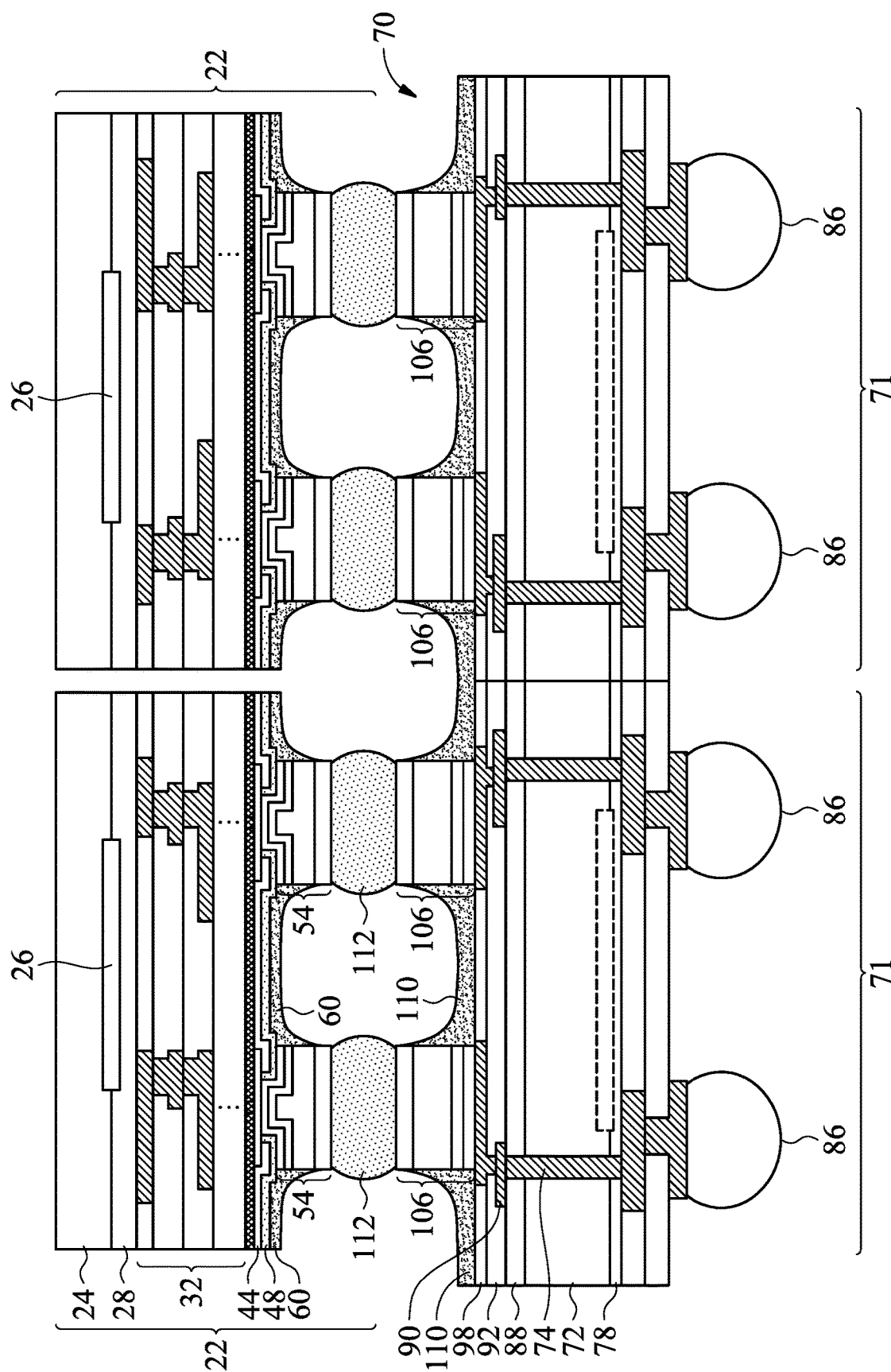

Referring to FIG. 20, package components 22 are placed over package component 70, with each of package components 22 aligned to one of the package components 71. Solder regions 108 are in contact with the respective solder regions 56. Next, a reflow process is performed so that solder regions 108 join with the respective solder regions 56 to form solder regions 112. The resulting structure is shown in FIG. 21. The respective process is illustrated as process 228 in the process flow shown in FIG. 24. In the reflow process, since the wettable sidewalls of metal bumps 54 and 106 are protected by protection layers 60 and 110, respectively, solder will not flow to the surfaces of metal bumps 54 and 106 to cause the solder loss from the regions between metal bumps 54 and 106. Rather, the solder is mostly between metal bumps 54 and the respective metal bumps 106.

Figure 22:
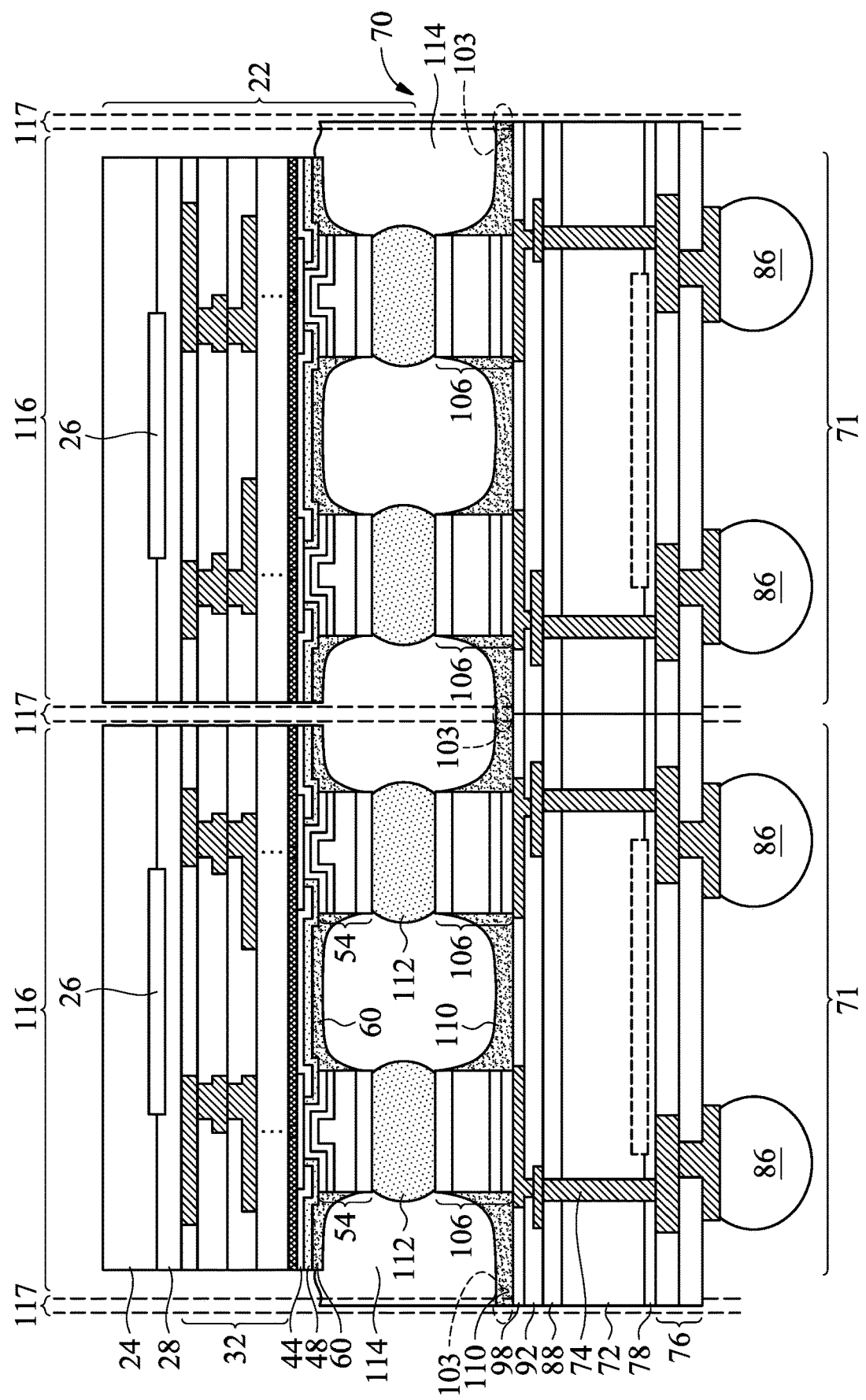

Referring to FIG. 22, underfill 114 is disposed into the gaps between package components 22 and 70. The respective process is illustrated as process 230 in the process flow shown in FIG. 24. Underfill 114 may include a base material and filler particles therein. The base material may include an epoxy, a polymer, or the like. The filler particles may include silica, aluminum oxide, or the like. The filler particles may have spherical shapes, and may have different diameters. Since underfill 114 and protection layers 54/106 are formed of different materials, and are formed in different processes, there are distinguishable interfaces between underfill 114 and protection layers 60 and 110. Since regions 103 may or may not include protection layer 110 therein, underfill 114 may (or may not) extend into the spaces between neighboring portions of protection layer 110 to contact the underlying dielectric layer (such as layer 98).

Figure 23:
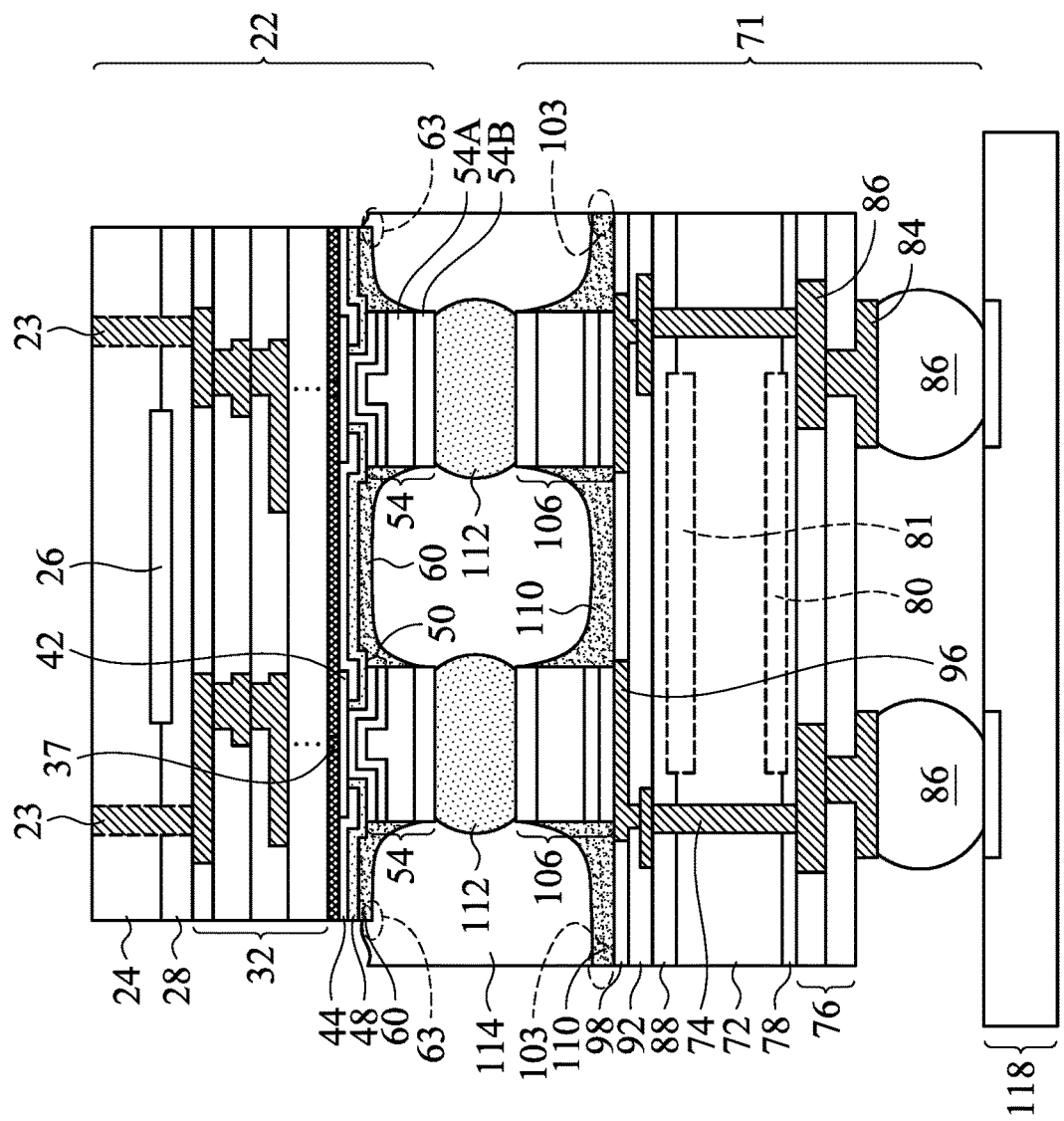

Next, as shown in FIG. 23, a singulation process is performed to separate package component 70 and the overlying features including package components 22, protection layers 60 and underfill 114 into a plurality of packages 116, which are identical to each other, and FIG. 23 illustrates one of the resulting packages 116. The respective process is illustrated as process 232 in the process flow shown in FIG. 24. The blade used in the singulation process passes scribe lines 117. Since scribe lines 117 may include, or may be free from protection layer 110, as represented by regions 103 that may or may not include protection layer 110, the blade may cut through protection layer 110, or may pass through the spaces between neighboring portions of protection layer 110.

FIG. 23 further illustrates the bonding of package 116 to package component 118, which may be a printed circuit board, an interposer, a package substrate, or the like. In accordance with some embodiments, package components 22 may include through-vias 23 in substrate 24, and metal bumps (not shown) may be formed on the top surface of package components 22. The through-vias 23 in substrate 24 is shown using dashed lines to indicate they may or may not be formed. The metal bumps may be used to bond package components 22 to overlying package components such as device dies. For example, High Bandwidth Memory (HBM) cubes may be formed when package component 22 is bonded with overlying memory dies. In addition, instead of forming integrated circuits 80, integrated circuits 81 may be formed at an opposite surface of substrate 72 than the surface at which circuits 80 are formed.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Reliability tests revealed that when packages having the protruding metal bumps and solder regions are stored at elevated temperatures, for example, over 100° C., the solder regions between the metal bumps suffer from solder loss due to the migration of the solder to the sidewalls of metal bumps, leading to voids in the solder regions. Furthermore, in the reflow process to bond package components, solder may also flow to the sidewalls of metal bumps, again leading to solder loss. By forming non-wettable protection layers to protect the sidewalls of the metal bumps, the solder loss is at least reduced, and may be eliminated.

In accordance with some embodiments of the present disclosure, a method of forming a package includes forming a metal bump on a top surface of a first package component; forming a solder region on a top surface of the metal bump; forming a protection layer extending on a sidewall of the metal bump; reflowing the solder region to bond the first package component to a second package component; and dispensing an underfill between the first package component and the second package component, wherein the underfill is in contact with the protection layer. In an embodiment, the protection layer is formed through inkjet printing. In an embodiment, in the inkjet printing, the protection layer is printed to a location spaced apart from the metal bump, and the protection layer extends to the sidewall of the metal bump through capillary action. In an embodiment, the forming the protection layer comprises: spin coating the protection layer on the first package component, wherein the protection layer comprises a portion on a top surface of the solder region; and performing a lithography process to remove the portion of the protection layer on the top surface of the solder region. In an embodiment, the forming the protection layer comprises dispensing a light-sensitive polymer, and the protection layer is free from filler particles therein. In an embodiment, the protection layer is spaced apart from the solder region. In an embodiment, the method further comprises, after the protection layer is formed, sawing the first package component from a respective wafer, wherein the sawing is performed after the underfill is dispensed. In an embodiment, the method further comprises removing a portion of the protection layer from a scribe line between the first package component and an additional component, wherein the first package component and the additional component are portions of an unsawed wafer. In an embodiment, the forming the metal bump and the forming the solder region comprise: forming a patterned plating mask having an opening therein; and plating the metal bump and the solder region in the opening.

In accordance with some embodiments of the present disclosure, a method of forming a package includes forming a plating mask at a top surface of a first package component; plating a first metal bump in an opening of the plating mask; plating a first solder region in the opening and over the first metal bump; removing the plating mask, wherein the first metal bump protrudes higher than a top dielectric layer of the first package component; reflowing the first solder region; and forming a first dielectric protection layer on the first package component, wherein the first dielectric protection layer contacts a vertical sidewall of the first metal bump. In an embodiment, the forming the first dielectric protection layer comprises coating a light-sensitive polymer. In an embodiment, the first dielectric protection layer is formed as being separated from the first solder region. In an embodiment, the forming the first dielectric protection layer comprises an inkjet printing process, and the first dielectric protection layer flows to cover substantially an entirety of the vertical sidewall of the first metal bump. In an embodiment, the first dielectric protection layer contacts the top dielectric layer, and the first dielectric protection layer and the top dielectric layer are formed of a same dielectric material, and are formed in separate process steps. In an embodiment, the method further comprises forming a second package component comprising: forming a second metal bump; forming a second solder region on the second metal bump; and forming a second dielectric protection layer contacting a sidewall of the second metal bump; bonding the first package component to the second package component, with the first solder region and the second solder region being reflowed as a third solder region; and dispensing an underfill between the first package component and the second package component, wherein the underfill contacts both the first dielectric protection layer and the second dielectric protection layer.

In accordance with some embodiments of the present disclosure, a package of semiconductor devices includes a first package component including a dielectric layer; a metal bump protruding beyond the dielectric layer; a solder region over and contacting the metal bump; and a protection layer contacting a sidewall of the metal bump and a surface of the dielectric layer, wherein the protection layer is formed of a dielectric material. In an embodiment, the protection layer is free from filler particles therein. In an embodiment, the package further comprises a second package component bonded to the first package component; and an underfill contacting the protection layer. In an embodiment, the protection layer is spaced apart from the solder region. In an embodiment, the protection layer and the dielectric layer are formed of a same dielectric material, and have a distinguishable interface therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
 a first package component comprising:
  a dielectric layer;
  a metal bump protruding beyond the dielectric layer;
  an additional metal bump protruding beyond the dielectric layer;
  a solder region over and contacting the metal bump; and
  a protection layer contacting a sidewall of the metal bump and a surface of the dielectric layer, wherein the protection layer is formed of a dielectric material, and wherein the protection layer comprises:
   a first portion contacting the sidewall of the metal bump, wherein the first portion comprises a curved top surface, and wherein parts of the curved top surface that are closer to the metal bump are increasingly higher than parts of the curved top surface that are farther away the metal bump;
   a second portion contacting an additional sidewall of the additional metal bump; and
   a third portion connecting the first portion to the second portion.

2. The package of claim 1, wherein the protection layer is free from filler particles therein.

3. The package of claim 1 further comprising:
 a second package component bonded to the first package component; and
 an underfill contacting the protection layer, wherein the underfill comprises a portion lower than a bottom surface of the metal bump.

4. The package of claim 1, wherein the protection layer is lower than, and is spaced apart from, the solder region.

5. The package of claim 1, wherein the protection layer and the dielectric layer are formed of a same dielectric material, and have a distinguishable interface therebetween.

6. The package of claim 1, wherein the protection layer comprises polyimide, polybenzoxazole (PBO), or benzocyclobutene (BCB).

7. The package of claim 1, wherein the first package component comprises an edge, and the protection layer is recessed laterally from the edge.

8. The package of claim 1, wherein the protection layer has a curved top surface, with a portion of the curved top surface in middle of the metal bump and the additional metal bump being lower than a first topmost end of the first portion and a second topmost end of the second portion.

9. A package comprising:
 an interposer comprising:
  a first semiconductor substrate;
  a through-via penetrating through the first semiconductor substrate;
  a first conductive pillar over and electrically coupling to the through-via; and
  a first dielectric layer formed of a first photo sensitive material, the first dielectric layer comprising a curved top surface, and the first dielectric layer comprising a first portion on a first sidewall of the first conductive pillar;
 a package component comprising:
  a second semiconductor substrate;
  a second conductive pillar underlying the second semiconductor substrate; and
  a second dielectric layer formed of a second photo sensitive material, the second dielectric layer comprising a curved bottom surface, and the second dielectric layer comprising a second portion on a second sidewall of the second conductive pillar; and
 a solder region bonding the first conductive pillar to the second conductive pillar.

10. The package of claim 9, wherein the first dielectric layer and the second dielectric layer are free from filler particles therein.

11. The package of claim 9, wherein the first dielectric layer and the second dielectric layer are spaced apart from each other.

12. The package of claim 9 further comprising an underfill between, and contact both of, the first dielectric layer and the second dielectric layer, wherein the underfill comprises a lower portion lower than a top surface of the first conductive pillar, and an upper portion higher than a bottom surface of the second conductive pillar.

13. The package of claim 9, wherein a top end of the first portion of the first dielectric layer on the first sidewall of the first conductive pillar is coplanar with or lower than a bottom surface of the solder region.

14. The package of claim 9, wherein the curved top surface of the first dielectric layer is smoothly curved.

15. The package of claim 14, wherein the first dielectric layer and the second dielectric layer are formed of materials selected from polyimide, polybenzoxazole (PBO), and benzocyclobutene (BCB).

16. The package of claim 9, wherein a topmost end of the curved top surface is joined to the metal bump.

17. A package comprising:
a package component comprising:
- a first semiconductor substrate;
- a surface dielectric layer over the first semiconductor substrate;
- a first conductive pillar comprising a first sidewall;
- a second conductive pillar comprising a second sidewall, the first conductive pillar being spaced apart the second conductive pillar, wherein the first conductive pillar and the second conductive pillar protrude higher than the surface dielectric layer; and a dielectric layer comprising:
- a third sidewall contacting the first sidewall;
- a fourth sidewall contacting the second sidewall; and
- a bottom surface contacting the surface dielectric layer, wherein from a middle point to the first sidewall, heights of the dielectric layer are increasingly greater, with the middle point being in middle between the first sidewall and the second sidewall.

18. The package of claim 17, wherein the dielectric layer comprises a top surface, and wherein from the middle point to the first sidewall, portions of the top surfaces are increasingly higher.

19. The package of claim 17 further comprising a solder region over the first conductive pillar, wherein the dielectric layer is separated from the solder region.

20. The package of claim 17, wherein the dielectric layer has a curved top surface.

* * * * *